(12) United States Patent
Chen et al.

(10) Patent No.: US 12,328,911 B2
(45) Date of Patent: Jun. 10, 2025

(54) SEMICONDUCTOR DEVICE

(71) Applicant: AUO Corporation, Hsinchu (TW)

(72) Inventors: Yen-Hao Chen, Hsinchu (TW);
Chen-Shuo Huang, Hsinchu (TW);
Yang-Shun Fan, Hsinchu (TW)

(73) Assignee: AUO Corporation, Hsinchu (TW)

( * ) Notice: Subject to any disclaimer, the term of this patent is extended or adjusted under 35 U.S.C. 154(b) by 511 days.

(21) Appl. No.: 17/878,936

(22) Filed: Aug. 2, 2022

(65) Prior Publication Data
US 2023/0187559 A1 Jun. 15, 2023

Related U.S. Application Data

(60) Provisional application No. 63/287,695, filed on Dec. 9, 2021.

(30) Foreign Application Priority Data

May 9, 2022 (TW) .................................. 111117305

(51) Int. Cl.
| | | |
|---|---|---|
| H01L 29/786 | (2006.01) | |
| H01L 29/40 | (2006.01) | |
| H01L 29/417 | (2006.01) | |
| H01L 29/423 | (2006.01) | |
| H01L 29/66 | (2006.01) | |
| H01L 51/05 | (2006.01) | |
| H10D 30/01 | (2025.01) | |
| H10D 30/67 | (2025.01) | |

(Continued)

(52) U.S. Cl.
CPC ....... H10D 30/6757 (2025.01); H10D 30/031 (2025.01); H10D 30/6729 (2025.01); H10D 30/673 (2025.01); H10D 64/01 (2025.01); H10K 10/481 (2023.02); H10K 10/486 (2023.02)

(58) Field of Classification Search
CPC ............. H10D 30/6757; H10D 30/031; H10D 30/6729; H10D 30/673; H10D 64/01; H10D 12/032; H10D 10/821; H10K 10/481; H10K 10/486; H02K 15/027; H10H 20/8142
USPC .......................................................... 257/66
See application file for complete search history.

(56) References Cited

U.S. PATENT DOCUMENTS

| | | |
|---|---|---|
| 5,909,615 A | 6/1999 | Kuo |
| 7,265,393 B2 | 9/2007 | Schuele et al. |

(Continued)

FOREIGN PATENT DOCUMENTS

| | | |
|---|---|---|
| CN | 110429139 | 11/2019 |
| CN | 111223939 | 6/2020 |

(Continued)

*Primary Examiner* — Tong-Ho Kim
(74) *Attorney, Agent, or Firm* — JCIPRNET

(57) ABSTRACT

A semiconductor device, including a first gate, a second gate, a third gate, a first semiconductor layer, a second semiconductor layer, a source, and a drain, is provided. The first semiconductor layer is located between the first gate and the second gate. The second gate is located between the first semiconductor layer and the second semiconductor layer. The second semiconductor layer is located between the second gate and the third gate. The source is electrically connected to the first semiconductor layer and the second semiconductor layer. The drain is electrically connected to the first semiconductor layer and the second semiconductor layer.

13 Claims, 20 Drawing Sheets

(51) Int. Cl.
*H10D 64/01* (2025.01)
*H10K 10/46* (2023.01)

(56) References Cited

U.S. PATENT DOCUMENTS

| | | |
|---|---|---|
| 9,601,518 B2 | 3/2017 | Moon et al. |
| 9,653,493 B2 | 5/2017 | Ellinger et al. |
| 2004/0174349 A1 | 9/2004 | Libsch et al. |
| 2007/0272948 A1 | 11/2007 | Koo et al. |
| 2009/0020817 A1* | 1/2009 | Park ................ H10D 88/01 |
| | | 438/153 |
| 2010/0044708 A1 | 2/2010 | Lin et al. |
| 2013/0161713 A1* | 6/2013 | Yamazaki ............ H10B 12/01 |
| | | 257/296 |
| 2020/0411511 A1 | 12/2020 | Rachmady et al. |

FOREIGN PATENT DOCUMENTS

| | | |
|---|---|---|
| CN | 113113425 | 7/2021 |
| JP | 2003273228 | 9/2003 |
| JP | 2017011173 | 1/2017 |
| JP | 2017011173 A * | 1/2017 |
| TW | I302032 | 10/2008 |
| TW | 201009954 | 3/2010 |

\* cited by examiner

SEMICONDUCTOR DEVICE

CROSS-REFERENCE TO RELATED APPLICATION

This application claims the priority benefit of U.S. Provisional Application No. 63/287,695, filed on Dec. 9, 2021 and Taiwan Application No. 111117305, filed on May 9, 2022. The entirety of each of the above-mentioned patent applications is hereby incorporated by reference herein and made a part of this specification.

BACKGROUND

Technical Field

The disclosure relates to a semiconductor device.

Description of Related Art

The dual-gate thin film transistor has the advantage of high driving current, so the dual-gate thin film transistor is often used as a driving element of an organic light emitting diode display device or a micro light emitting diode display device. Specifically, in order for the display device to have a sufficiently high resolution, the area of the driving element for driving a light emitting diode in the display device is limited. Therefore, many manufacturers choose to dispose the dual-gate thin film transistor as the driving element in the limited area, so that the driving element has a sufficiently high driving current.

However, compared with the conventional single-gate thin film transistor, the reliability of the dual-gate thin film transistor is lower, and the dual-gate thin film transistor is prone to driving current degradation and threshold voltage shift after long-term operation.

SUMMARY

The disclosure provides a semiconductor device, which can improve the negative influence caused by the current stress or the hot carrier effect.

A semiconductor device includes a first gate, a second gate, a third gate, a first semiconductor layer, a second semiconductor layer, a source, and a drain. The first semiconductor layer is located between the first gate and the second gate. The second gate is located between the first semiconductor layer and the second semiconductor layer. The second semiconductor layer is located between the second gate and the third gate. The source is electrically connected to the first semiconductor layer and the second semiconductor layer. The drain is electrically connected to the first semiconductor layer and the second semiconductor layer.

DETAILED DESCRIPTION OF DISCLOSED EMBODIMENTS

Figure 1A:
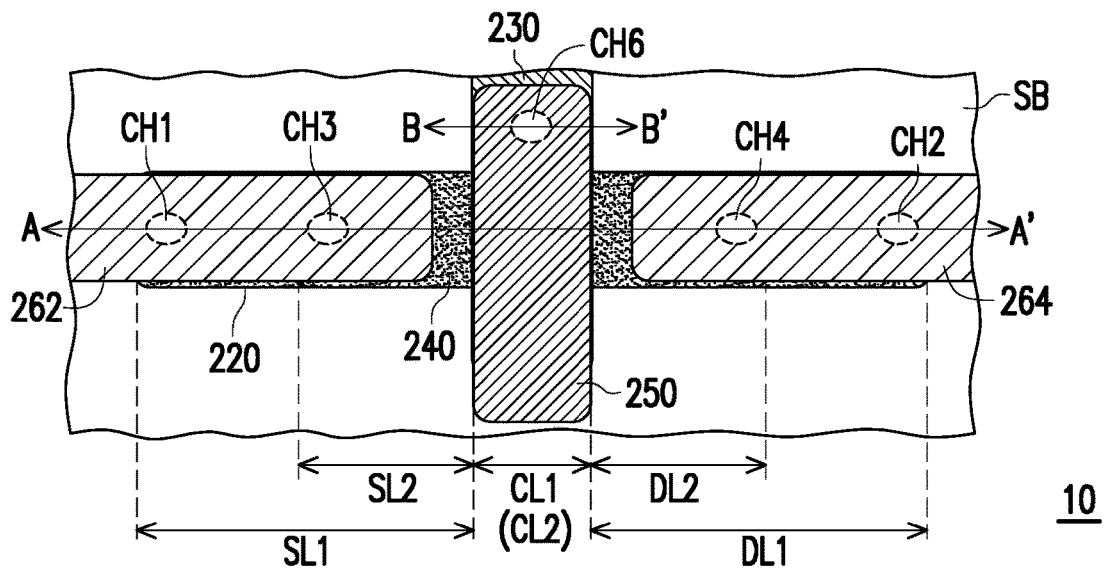
FIG. 1A is a schematic top view of a semiconductor device according to an embodiment of the disclosure.
Figure 1B:
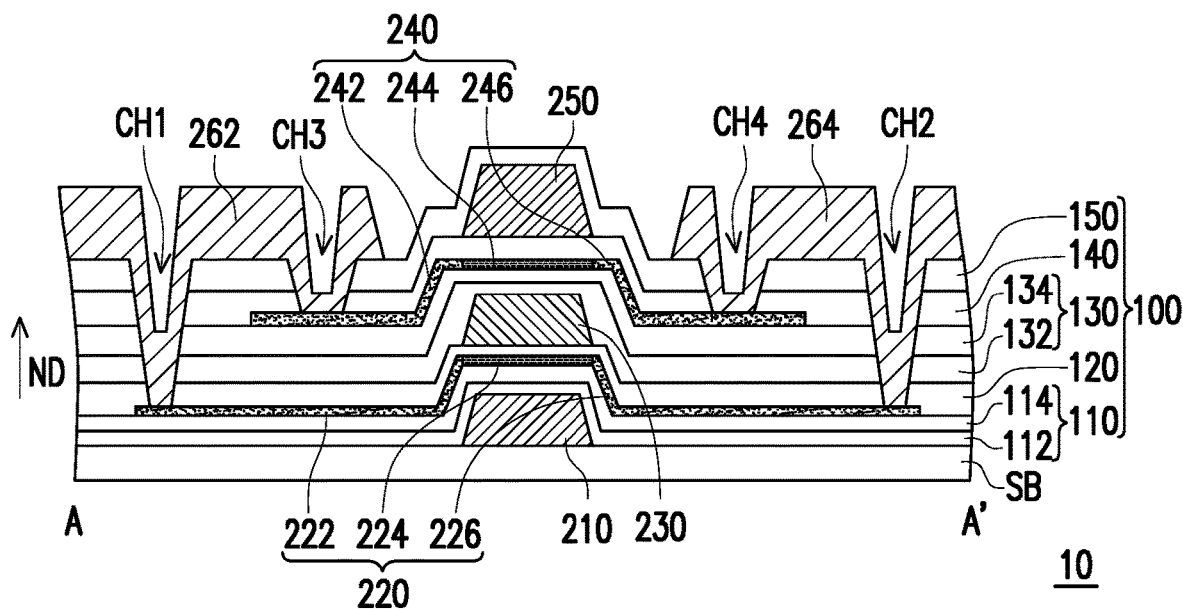
FIG. 1B is a schematic cross-sectional view taken along a line A-A' of FIG. 1A.
Figure 1C:
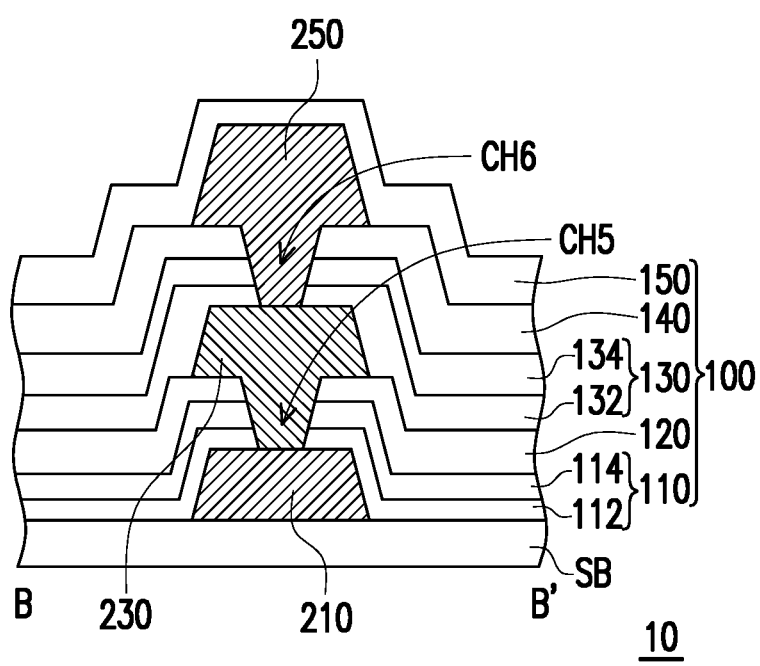
FIG. 1C is a schematic cross-sectional view taken along a line B-B' of FIG. 1A.

FIG. 1A is a schematic top view of a semiconductor device 10 according to an embodiment of the disclosure. FIG. 1B is a schematic cross-sectional view taken along a line A-A' of FIG. 1A. FIG. 1C is a schematic cross-sectional view taken along a line B-B' of FIG. 1A. In FIG. 1A, a first gate 210, a second gate 230, a third gate 250, a first semiconductor layer 220, a second semiconductor layer 240, a source 262, and a drain 264 are shown, and other components are omitted.

Please refer to FIG. 1A to FIG. 1C. The semiconductor device 10 includes the first gate 210, the second gate 230, the third gate 250, the first semiconductor layer 220, the second semiconductor layer 240, the source 262, and the drain 264. In this embodiment, the semiconductor device 10 further includes a substrate SB and an insulating structure 100.

The material of the substrate SB includes glass, quartz, organic polymer, opaque/reflective material (for example, conductive material, metal, wafer, ceramics, or other suitable materials), or other suitable materials. If the conductive material or the metal is used, an insulating layer (not shown) is covered on the substrate SB to avoid short circuit.

The first gate 210, the second gate 230, and the third gate 250 are located on the substrate 100. In some embodiments, one or more buffer layers (not shown) are further included between the first gate 210 and the substrate 100. The materials of the first gate 210, the second gate 230, and the third gate 250 include chromium, gold, silver, copper, tin, lead, hafnium, tungsten, molybdenum, neodymium, titanium, tantalum, aluminum, zinc, other metals, an alloy of the above, a metal oxide of the above, a metal nitride of the above, a combination of the above, or other conductive materials. For example, the first gate 210, the second gate 230, and the third gate 250 are each a stacked layer of titanium metal, aluminum metal, and titanium metal. The first gate 210, the second gate 230, and the third gate 250 are electrically connected to each other.

The first semiconductor layer 220 is located between the first gate 210 and the second gate 230. The second gate 230 is located between the first semiconductor layer 220 and the second semiconductor layer 240. The second semiconductor layer 240 is located between the second gate 220 and the third gate 250.

The materials of the first semiconductor layer 220 and the second semiconductor layer 240 include amorphous silicon, polycrystalline silicon, microcrystalline silicon, monocrystalline silicon, organic semiconductor materials, metal oxide semiconductor materials (for example, indium gallium zinc oxide (IGZO), ZnO, SnO, indium zinc oxide (IZO), gallium zinc oxide (GZO), zinc tin oxide (ZTO), indium tin oxide (ITO), or other suitable materials), other suitable materials or a combination of the above materials. The material of the first semiconductor layer 220 and the material of the second semiconductor layer 240 are the same as or different from each other.

In some embodiments, the thickness of the first semiconductor layer 220 and the thickness of the second semiconductor layer 240 are 10 nm to 80 nm. The thickness of the first semiconductor layer 220 and the thickness of the second semiconductor layer 240 are the same as or different from each other.

In this embodiment, the first semiconductor layer 220 includes a first source region 222, a first channel region 224, and a first drain region 226 that are connected in sequence. The resistivities of the first source region 222 and the first drain region 226 are less than the resistivity of the first channel region 224.

In this embodiment, the second semiconductor layer 240 includes a second source region 242, a second channel region 244, and a second drain region 246 that are connected in sequence. The resistivities of the second source region 242 and the second drain region 246 are less than the resistivity of the second channel region 244.

In some embodiments, the first gate 210, the second gate 230, the third gate 250, the first channel region 224, and the second channel region 244 overlap in a normal direction ND of a top surface of the substrate SB. A length CL1 of the first channel region 224 and a length CL2 of the second channel region 244 are the same as or different from each other. In this embodiment, a length SL2 of the second source region 242 and a length DL2 of the second drain region 246 are less than a length SL1 of the first source region 222 and a length DL1 of the first drain region 226, and the length of the second semiconductor layer 220 (the sum of the length SL2, the length CL2, and the length DL2) is less than the length of the first semiconductor layer 220 (the sum of the length SL1, the length CL1, and the length DL1).

The insulating structure 100 covers the first gate 210, the second gate 230, the third gate 250, the first semiconductor layer 220, and the second semiconductor layer 240. The insulating structure 100 has a first contact hole CH1, a second contact hole CH2, a third contact hole CH3, and a fourth contact hole CH4. In this embodiment, the insulating structure 100 further includes a fifth contact hole CH5 and a sixth contact hole CH6.

In this embodiment, the insulating structure 100 includes a first gate dielectric layer 110, a second gate dielectric layer 120, a third gate dielectric layer 130, a fourth gate dielectric layer 140, and a protective layer 150.

The first gate dielectric layer 110 is located between the first gate 210 and the first semiconductor layer 220. The first gate dielectric layer 110 has a single-layer or multi-layer structure. In this embodiment, the first gate dielectric layer 110 includes a first nitride layer 112 and a first oxygen-containing dielectric layer 114. The first nitride layer 112 contacts the first gate 210 and the first oxygen-containing dielectric layer 114 contacts the first semiconductor layer 220. In some embodiments, the material of the first nitride layer 112 includes, for example, silicon nitride or other suitable materials. In some embodiments, the thickness of the first nitride layer 112 is 30 nm to 300 nm. In some embodiments, the material of the first oxygen-containing dielectric layer 114 includes, for example, silicon oxynitride, silicon oxide, hafnium oxide, or other suitable materials. For example, the first oxygen-containing dielectric layer 114 is SiOxNy, where x is 1 to 0.5 and y is 0 to 0.5. In some embodiments, the thickness of the first oxygen-containing dielectric layer 114 is 50 nm to 200 nm.

The second gate dielectric layer 120 is located between the first semiconductor layer 220 and the second gate 230. The second gate dielectric layer 120 has a single-layer or multi-layer structure. In this embodiment, the material of the second gate dielectric layer 120 includes, for example, silicon oxynitride, silicon oxide, hafnium oxide, or other suitable materials. In some embodiments, the thickness of the second gate dielectric layer 120 is 50 nm to 200 nm.

The third gate dielectric layer 130 is located between the second gate 230 and the second semiconductor layer 240. The third gate dielectric layer 130 has a single-layer or multi-layer structure. In this embodiment, the third gate dielectric layer 130 includes a second nitride layer 132 and a second oxygen-containing dielectric layer 134. The second nitride layer 132 contacts the second gate 230 and the second oxygen-containing dielectric layer 134 contacts the second semiconductor layer 240. In some embodiments, the material of the second nitride layer 132 includes, for example, silicon nitride or other suitable materials. In some embodiments, the thickness of the second nitride layer 132 is 30 nm to 300 nm. In some embodiments, the material of the second oxygen-containing dielectric layer 134 includes, for example, silicon oxynitride, silicon oxide, hafnium oxide, or other suitable materials. For example, the second oxygen-containing dielectric layer 134 is SiOxNy, where x is 1 to 0.5 and y is 0 to 0.5. In some embodiments, the thickness of the second oxygen-containing dielectric layer 134 is 50 nm to 200 nm.

The fourth gate dielectric layer 140 is located between the second semiconductor layer 240 and the third gate 250. The fourth gate dielectric layer 140 has a single-layer or multi-layer structure. In this embodiment, the material of the fourth gate dielectric layer 140 includes, for example, silicon oxynitride, silicon oxide, hafnium oxide, or other suitable materials. In some embodiments, the thickness of the fourth gate dielectric layer 140 is 50 nm to 200 nm.

The protective layer 150 covers the third gate 250. The protective layer 150 has a single-layer or multi-layer structure. In this embodiment, the material of the protective layer 150 includes, for example, silicon oxynitride, silicon oxide, silicon nitride, or other suitable materials. In some embodiments, the thickness of the protective layer 150 is 100 nm to 600 nm.

In the insulating structure 100, the first contact hole CH1 and the second contact hole CH2 penetrate the second gate dielectric layer 120, the third gate dielectric layer 130, the fourth gate dielectric layer 140, and the protective layer 150. The first contact hole CH1 and the second contact hole CH2 respectively overlap with the first source region 222 and the first drain region 226 of the first semiconductor layer 220 in the normal direction ND.

In the insulating structure 100, the third contact hole CH3 and the fourth contact hole CH4 penetrate the fourth gate dielectric layer 140 and the protective layer 150. The third contact hole CH3 and the fourth contact hole CH4 respectively overlap with the second source region 242 and the second drain region 246 of the second semiconductor layer 240 in the normal direction ND of the top surface of the substrate SB. The second semiconductor layer 240 is located between the first contact hole CH1 and the second contact hole CH2, and the second semiconductor layer 240 is separated from the first contact hole CH1 and the second contact hole CH2.

In the insulating structure 100, the fifth contact hole CH5 penetrates the first gate dielectric layer 110 and the second gate dielectric layer 120, and the sixth contact hole CH6 penetrates the third gate dielectric layer 130 and the fourth gate dielectric layer 140. The second gate 230 is filled into the fifth contact hole CH5 to be electrically connected to the first gate 210, and the third gate 250 is filled into the sixth contact hole CH6 to be electrically connected to the second gate 230.

The source 262 and the drain 264 are respectively filled into the first contact hole CH1 and the second contact hole CH2 to be respectively electrically connected to the first source region 222 and the first drain region 226 of the first semiconductor layer 220, and the source 262 and the drain 264 are respectively filled into the third contact hole CH3 and the fourth contact hole CH4 to be respectively electrically connected to the second source region 242 and the second drain region 246 of the second semiconductor layer 240. The materials of the source 262 and the drain 264 include chromium, gold, silver, copper, tin, lead, hafnium, tungsten, molybdenum, neodymium, titanium, tantalum, aluminum, zinc, other metals, an alloy of the above, a metal oxide of the above, a metal nitride of the above, a combination of the above, or other conductive materials. For example, the source 262 and the drain 264 are each a stacked layer of titanium metal, aluminum metal, and titanium metal.

Based on the above, the semiconductor device 10 includes the first semiconductor layer 220 and the second semiconductor layer 240, so as to disperse the current between the source 262 and the drain 264, and improve the negative influence caused by the current stress or the hot carrier effect. In addition, the driving voltage of the semiconductor device 10 may be less than that of a dual-gate thin film transistor or a single-gate thin film transistor, so a preferred result can be obtained in a positive bias temperature stress (PBTS) test. The PBTS test is a test for measuring the amount of change in the threshold voltage under the condition of loading a positive voltage.

FIG. 2A to FIG. 2G are schematic cross-sectional views of a manufacturing method of the semiconductor device of FIG. 1A to FIG. 1C.

Figure 2A:
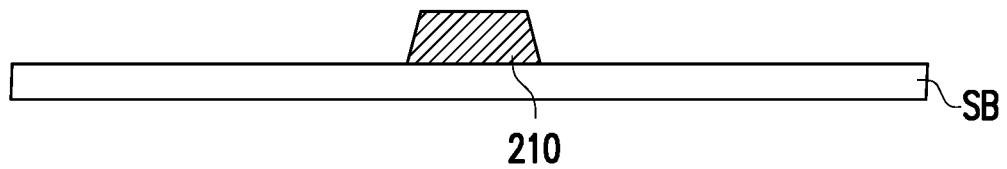
FIG. 2A to FIG. 2G are schematic cross-sectional views of a manufacturing method of the semiconductor device of FIG. 1A to FIG. 1C.

Please refer to FIG. 2A. The first gate 210 is formed on the substrate SB.

Figure 2B:
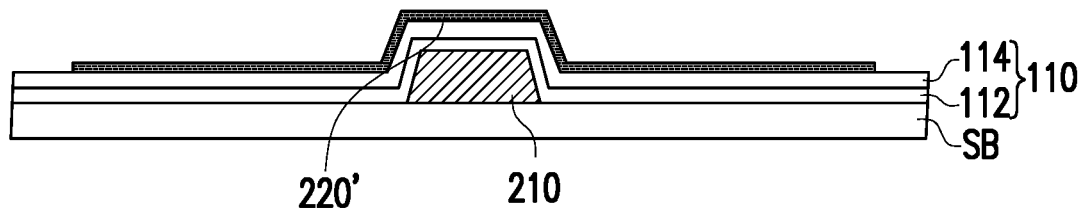

Please refer to FIG. 2B. The first gate dielectric layer 110 is formed on the first gate 210. The method of forming the first gate dielectric layer 110 includes forming the first nitride layer 112 on the first gate 210 and forming the first oxygen-containing dielectric layer 114 on the first nitride layer 112.

The first semiconductor material layer 220' is formed on the first gate dielectric layer 110.

Figure 2C:
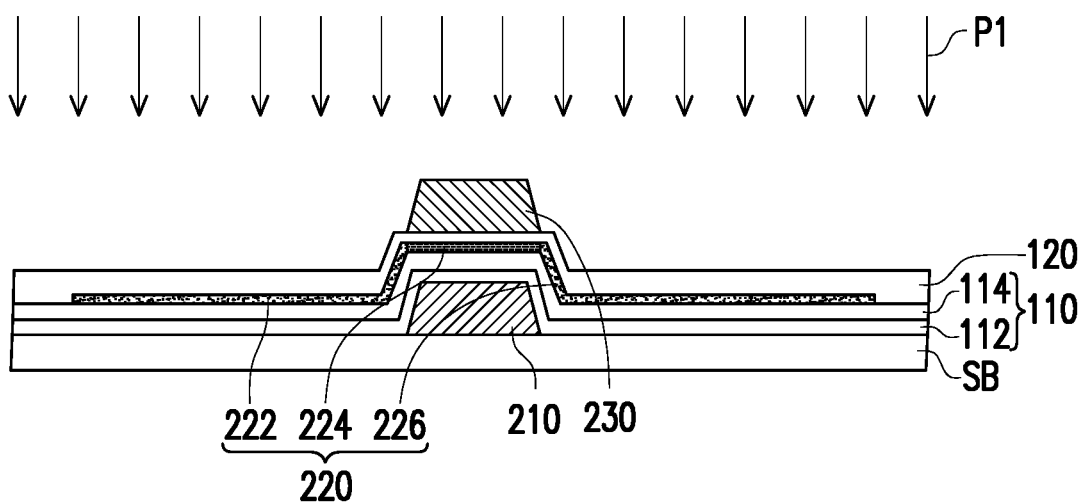

Please refer to FIG. 2C. The second gate dielectric layer 120 is formed on the first material semiconductor layer 220'. The second gate 230 is formed on the second gate dielectric layer 120. Using the second gate 230 as a mask, a doping process P1 is executed on the first semiconductor material layer 220' to form the first semiconductor layer 220 including the first source region 222, the first channel region 224, and the first drain region 226, wherein the first channel region 224 is aligned with the second gate 230. In some embodiments, the doping process P1 includes a hydrogen plasma process, an ion implantation process, or other suitable processes. It should be noted that in some embodiments, hydrogen elements in the formed gate dielectric layer and the subsequently formed gate dielectric layer and/or protective layer may diffuse into the first semiconductor layer 220 during the process, thereby changing the hydrogen content in the first semiconductor layer 220.

In some embodiments, before the second gate 230 is formed, an etching process is executed to form the fifth contact hole (please refer to FIG. 1C) penetrating the first gate dielectric layer 110 and the second gate dielectric layer 120, wherein the fifth contact hole exposes the first gate 210. Next, the second gate 230 is formed in the fifth contact hole to be electrically connected to the first gate 210.

Figure 2D:
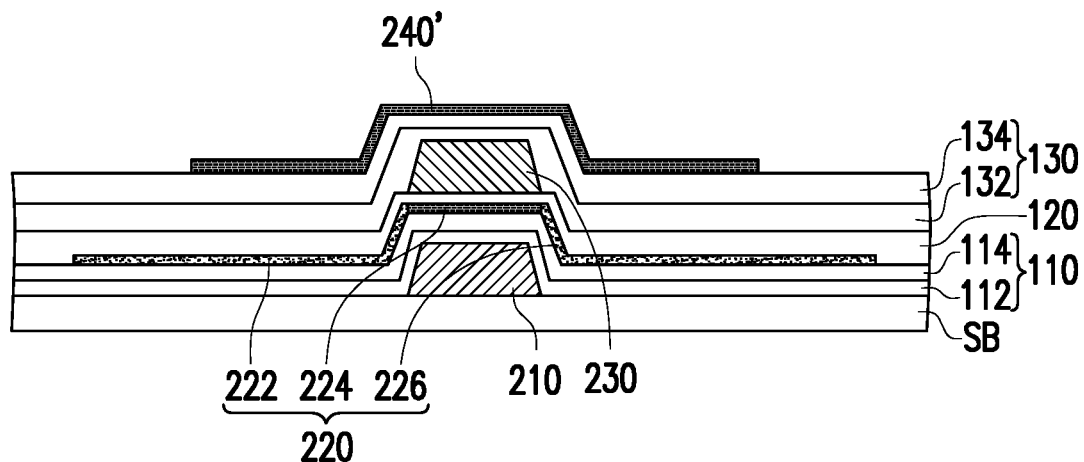

Please refer to FIG. 2D. The third gate dielectric layer 130 is formed on the second gate 230. The method of forming the third gate dielectric layer 130 includes forming the second nitride layer 132 on the second gate 230 and forming the second oxygen-containing dielectric layer 134 on the second nitride layer 132.

A second material layer 240' is formed on the third gate semiconductor dielectric layer 130.

Figure 2E:
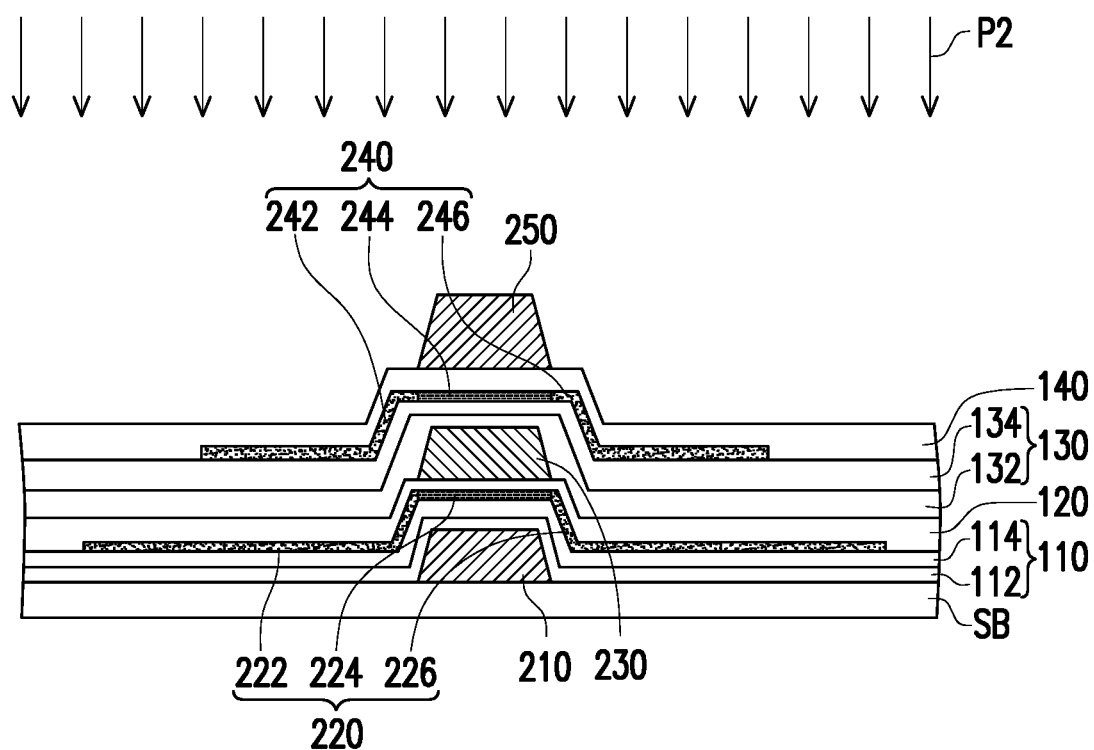

Please refer to FIG. 2E. The fourth gate dielectric layer 140 is formed on the second semiconductor material layer 240'.

The third gate 250 is formed on the fourth gate dielectric layer 140. Using the third gate 250 as a mask, a doping process P2 is executed on the second semiconductor material layer 240' to form the second semiconductor layer 240 including the second source region 242, the second channel region 244, and the second drain region 246, wherein the second channel region 244 is aligned with the third gate 250. In some embodiments, the doping process P2 includes a hydrogen plasma process, an ion implantation process, or other suitable processes. In some embodiments, hydrogen elements in the formed gate dielectric layer and the subsequently formed gate dielectric layer and/or protective layer may diffuse into the second semiconductor layer 240 during the process, thereby changing the hydrogen content in the second semiconductor layer 240.

In some embodiments, before the third gate 250 is formed, an etching process is executed to form the sixth contact hole (please refer to FIG. 1C) penetrating the third gate dielectric layer 130 and the fourth gate dielectric layer 140, wherein the sixth contact hole exposes the second gate 230. Next, the third gate 250 is formed in the sixth contact hole to be electrically connected to the second gate 230.

Figure 2F:
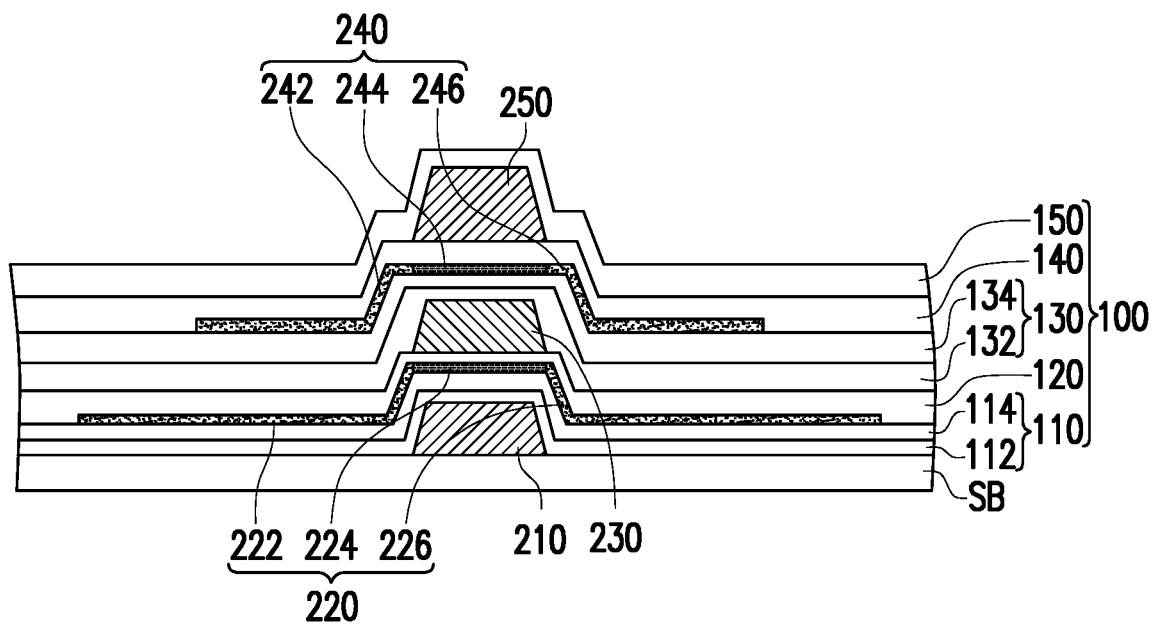

Please refer to FIG. 2F. The protective layer 150 is formed on the third gate 250. In some embodiments, the protective layer 150 contains hydrogen elements, and during the process of forming the protective layer 150 or after the protective layer 150 is formed, a heat treatment is performed to diffuse the hydrogen elements in the protective layer 150 downward to the second semiconductor layer 240, thereby reducing the resistivity of the second semiconductor layer 240.

Figure 2G:
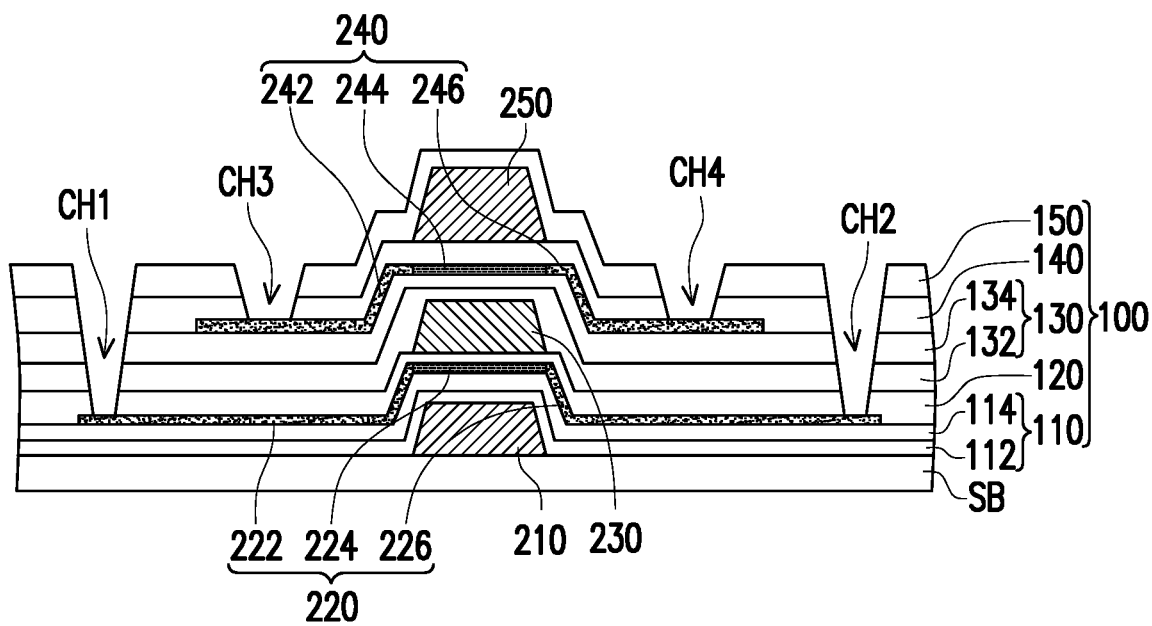

Please refer to FIG. 2G. A patterning process is executed to form the insulating structure 100 having the first contact hole CH1, the second contact hole CH2, the third contact hole CH3, and the fourth contact hole CH4. The first contact hole CH1 and the second contact hole CH2 respectively expose the first source region 222 and the first drain region 226 of the first semiconductor layer 220, and the third contact hole CH3 and the fourth contact hole CH4 respectively expose the second source region 242 and the second drain region 246 of the second semiconductor layer 240. In some embodiments, the patterning process includes the following steps. A patterned photoresist layer (not shown) is formed on the protective layer 150. Then, using the patterned photoresist layer as a mask, an etching process is executed on the protective layer 150, the fourth gate dielectric layer 140, the third gate dielectric layer 130, and the second gate dielectric layer 120. The first semiconductor layer 220 and the second semiconductor layer 240 may be used as etch stop layers for the etching process. In other words, the first contact hole CH1, the second contact hole CH2, the third contact hole CH3, and the fourth contact hole CH4 may be formed together during the same etching process.

Finally, please return to FIG. 1B. The source 262 and the drain 264 are formed on the protective layer 150, and the source 262 and the drain 264 are filled into the first contact hole CH1, the second contact hole CH2, the third contact hole CH3, and the fourth contact hole CH4. So far, the semiconductor device 10 is roughly completed.

Figure 3A:
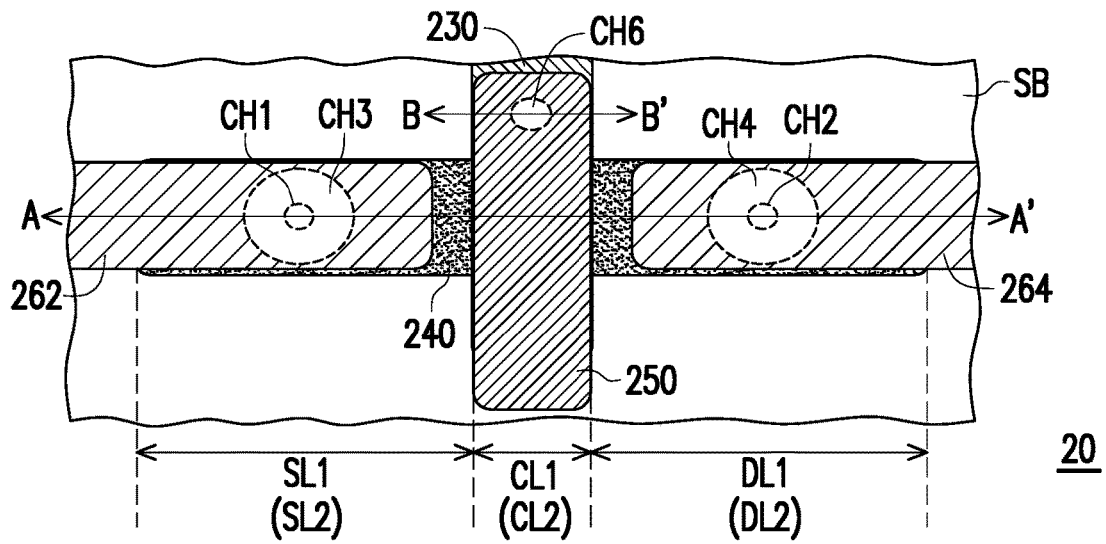
FIG. 3A is a schematic top view of a semiconductor device according to an embodiment of the disclosure.
Figure 3B:
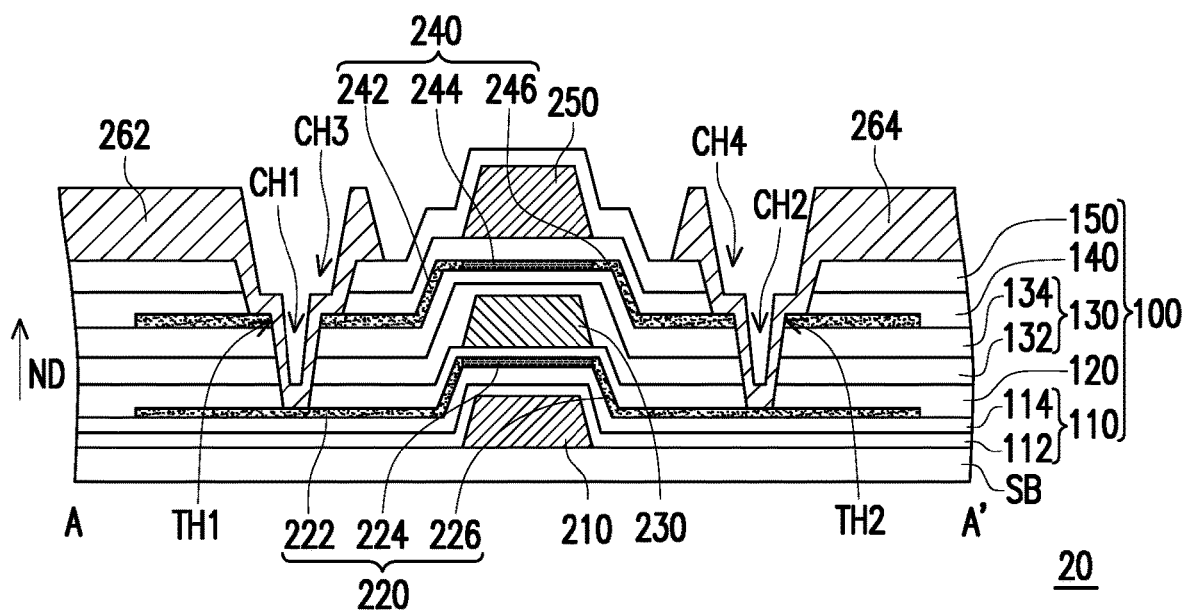
FIG. 3B is a schematic cross-sectional view taken along a line A-A' of FIG. 3A.
Figure 3C:
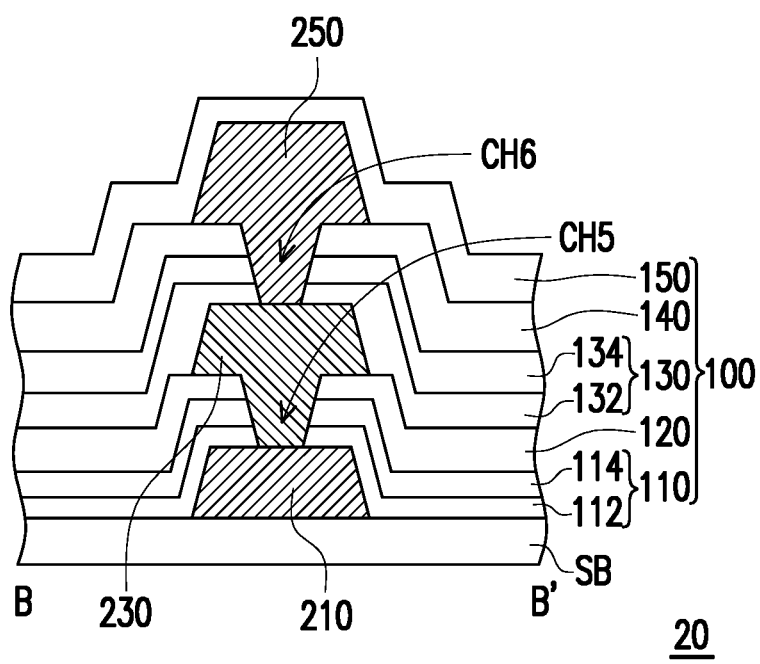
FIG. 3C is a schematic cross-sectional view taken along a line B-B' of FIG. 3A.

FIG. 3A is a schematic top view of a semiconductor device 20 according to an embodiment of the disclosure. FIG. 3B is a schematic cross-sectional view taken along a line A-A' of FIG. 3A. FIG. 3C is a schematic cross-sectional view taken along a line B-B' of FIG. 3A. It must be noted here that the embodiment of FIG. 3A to FIG. 3C continue to use the reference numerals and some content of the embodiment of FIG. 1A to FIG. 1C, wherein the same or similar reference numerals are adopted to denote the same or similar elements, and the description of the same technical content is omitted. For the description of the omitted part, reference may be made to the foregoing embodiments, which will not be repeated here.

The main difference between the semiconductor device 20 of FIG. 3A to FIG. 3C and the semiconductor device 10 of FIG. 1A to FIG. 1C is that the second semiconductor layer 240 of the semiconductor device 20 has a first through hole TH1 and a second through hole TH2.

Please refer to FIG. 3A to FIG. 3C. In this embodiment, the length SL2 of the second source region 242 and the length DL2 of the second drain region 246 are substantially equal to the length SL1 of the first source region 222 and the length DL1 of the first drain region 226, and the length of the second semiconductor layer 220 (the sum of the length SL2, the length CL2, and the length DL2) is substantially equal to the length of the first semiconductor layer 220 (the sum of the length SL1, the length CL1, and the length DL1).

The first through hole TH1 and the second through hole TH2 are respectively located in the second source region 242 and the second drain region 246 of the second semiconductor layer 240. The first through hole TH1 and the second through hole TH2 overlap with the first source region 222 and the first drain region 226 of the first semiconductor layer 220 in the normal direction ND of the top surface of the substrate SB.

The first contact hole CH1 and the second contact hole CH2 penetrate the second gate dielectric layer 120 and the third gate dielectric layer 130. The first contact hole CH1 and the second contact hole CH2 respectively overlap with the first through hole TH1 and the second through hole TH2 in the normal direction ND of the top surface of the substrate SB.

The third contact hole CH3 and the fourth contact hole CH4 penetrate the fourth gate dielectric layer 140 and the protective layer 150. The third contact hole CH3 and the fourth contact hole CH4 respectively overlap with the first through hole TH1 and the second through hole TH2 in the normal direction ND of the top surface of the substrate SB. The first through hole TH1 is located between the first contact hole CH1 and the third contact hole CH3, and the second through hole TH2 is located between the second contact hole CH2 and the fourth contact hole CH4.

The source 262 is filled into the first contact hole CH1, passes through the first through hole TH1, and is filled into the third contact hole CH3 to be electrically connected to the first source region 222 of the first semiconductor layer 220 and the second source region 242 of the second semiconductor layer 240. The drain 264 is filled into the second contact hole CH2, passes through the second through hole TH2, and is filled into the fourth contact hole CH4 to be electrically connected to the first drain region 226 of the first semiconductor layer 220 and the second drain region 246 of the second semiconductor layer 240.

In this embodiment, the width of the third contact hole CH3 and the width of the fourth contact hole CH4 are respectively greater than the width of the first through hole TH1 and the width of the second through hole TH2. Therefore, the source 262 and the drain 264 not only contact a sidewall of the first through hole TH1 and a sidewall of the second through hole TH2, but also contact a part of an upper surface of the second semiconductor layer 240, so as to increase the contact area between the source 262 and the second semiconductor layer 240 and the contact area between the drain 264 and the second semiconductor layer 240. In this embodiment, the contact area between the source 262 and the second semiconductor layer 240 is annular, and the contact area between the drain 264 and the second semiconductor layer 240 is also annular.

In this embodiment, the first contact hole CH1 overlaps with the third contact hole CH3, so the distance between the source 262 and the first channel region 224 is approximately equal to the distance between the source 262 and the second channel region 244. Similarly, the second contact hole CH2 overlaps with the fourth contact hole CH4, so the distance between the drain 264 and the first channel region 224 is approximately equal to the distance between the drain 264 and the second channel region 244. As such, current may be more evenly distributed to the first semiconductor layer 220 and the second semiconductor layer 240.

Based on the above, the semiconductor device 20 includes the first semiconductor layer 220 and the second semiconductor layer 240, so as to disperse the current between the source 262 and the drain 264, and improve the negative influence caused by the current stress or the hot carrier effect. In addition, the driving voltage of the semiconductor device 20 may be less than the driving voltage of a dual-gate thin film transistor or a single-gate thin film transistor, so the semiconductor device 20 can obtain a preferred result in a PBTS test.

FIG. 4A to FIG. 4E are schematic cross-sectional views of a manufacturing method of the semiconductor device 20 of FIG. 3A to FIG. 3C.

Figure 4A:
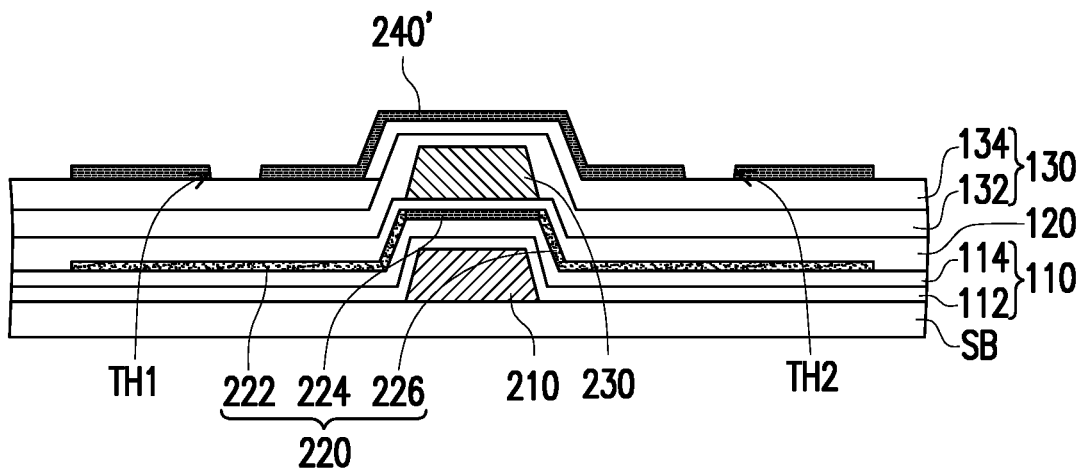
FIG. 4A to FIG. 4E are schematic cross-sectional views of a manufacturing method of the semiconductor device of FIG. 3A to FIG. 3C.

Please refer to FIG. 4A. Following the steps of FIG. 2C, the third gate dielectric layer 130 is formed on the second gate 230. The method of forming the third gate dielectric layer 130 includes forming the second nitride layer 132 on the second gate 230 and forming the second oxygen-containing dielectric layer 134 on the second nitride layer 132.

The second material layer 240' is formed on the third gate semiconductor dielectric layer 130. In this embodiment, the second semiconductor material layer 240' has the first through hole TH1 and the second through hole TH2.

Figure 4B:
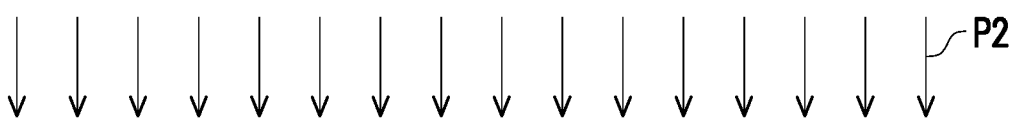
Figure 4B:
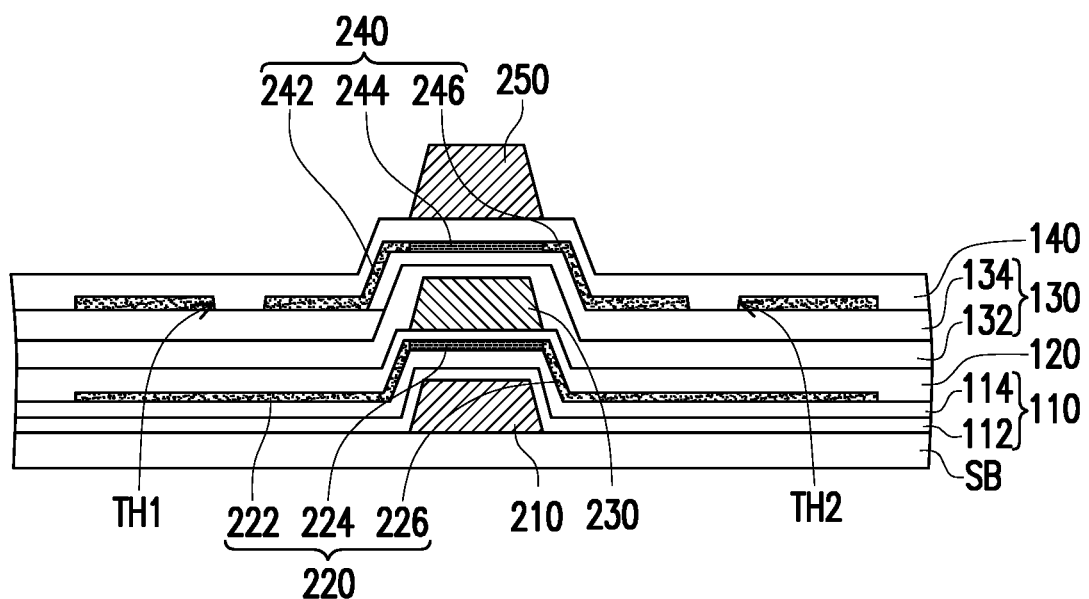

Please refer to FIG. 4B. The fourth gate dielectric layer 140 is formed on the second semiconductor material layer 240'. In this embodiment, the fourth gate dielectric layer 140 is filled into the first through hole TH1 and the second through hole TH2.

The third gate 250 is formed on the fourth gate dielectric layer 140. Using the third gate 250 as a mask, the doping process P2 is executed on the second semiconductor material layer 240' to form the second semiconductor layer 240 including the second source region 242, the second channel region 244, and the second drain region 246, wherein the second channel region 244 is aligned with the third gate 250. In some embodiments, the doping process P2 includes a hydrogen plasma process, an ion implantation process, or other suitable processes. In some embodiments, hydrogen elements in the formed gate dielectric layer and the subsequently formed gate dielectric layer and/or protective layer may diffuse into the second semiconductor layer 240 during the process, thereby changing the hydrogen content in the second semiconductor layer 240.

In some embodiments, before the third gate 250 is formed, an etching process is executed to form the sixth contact hole (please refer to FIG. 1C) penetrating the third gate dielectric layer 130 and the fourth gate dielectric layer 140, wherein the sixth contact hole exposes the second gate 230. Next, the third gate 250 is formed in the sixth contact hole to be electrically connected to the second gate 230.

Figure 4C:
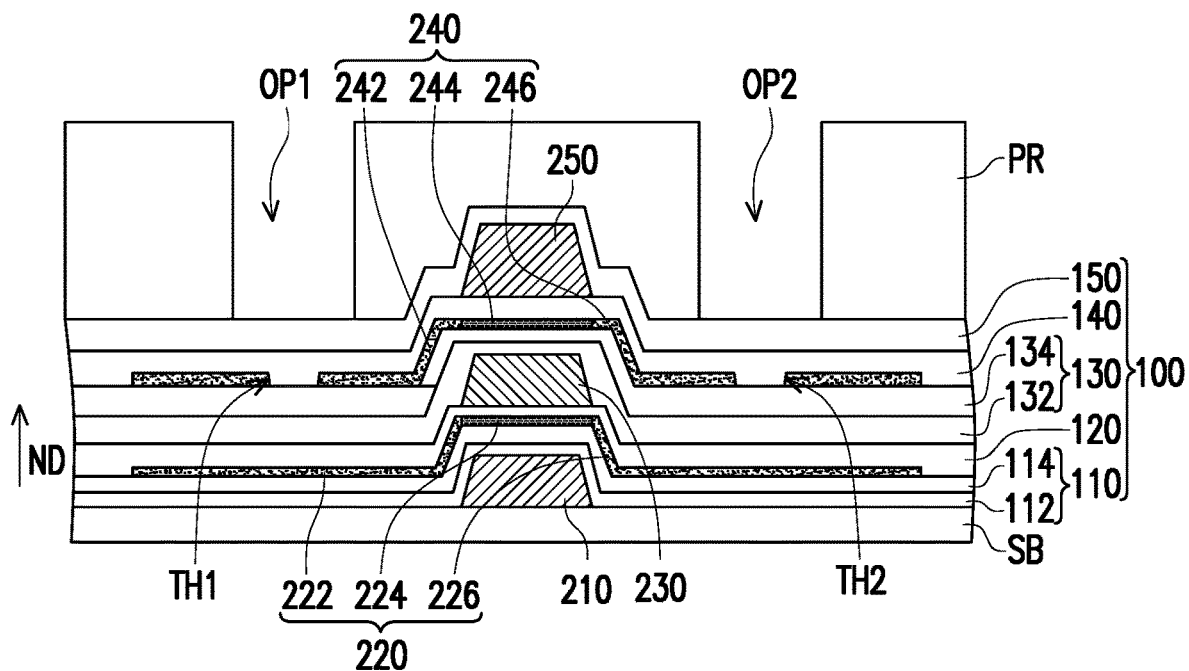

Please refer to FIG. 4C. A patterned photoresist layer PR is formed on the protective layer 150. The patterned photoresist layer PR includes a first opening OP1 and a second opening OP2, wherein the first opening OP1 and the second opening OP2 respectively overlap with the first through hole TH1 and the second through hole TH2 in the normal direction ND of the top surface of the substrate SB. The width of the first opening OP1 is greater than the width of the first through hole TH1, and the width of the second opening OP2 is greater than the width of the second through hole TH2.

Figure 4D:
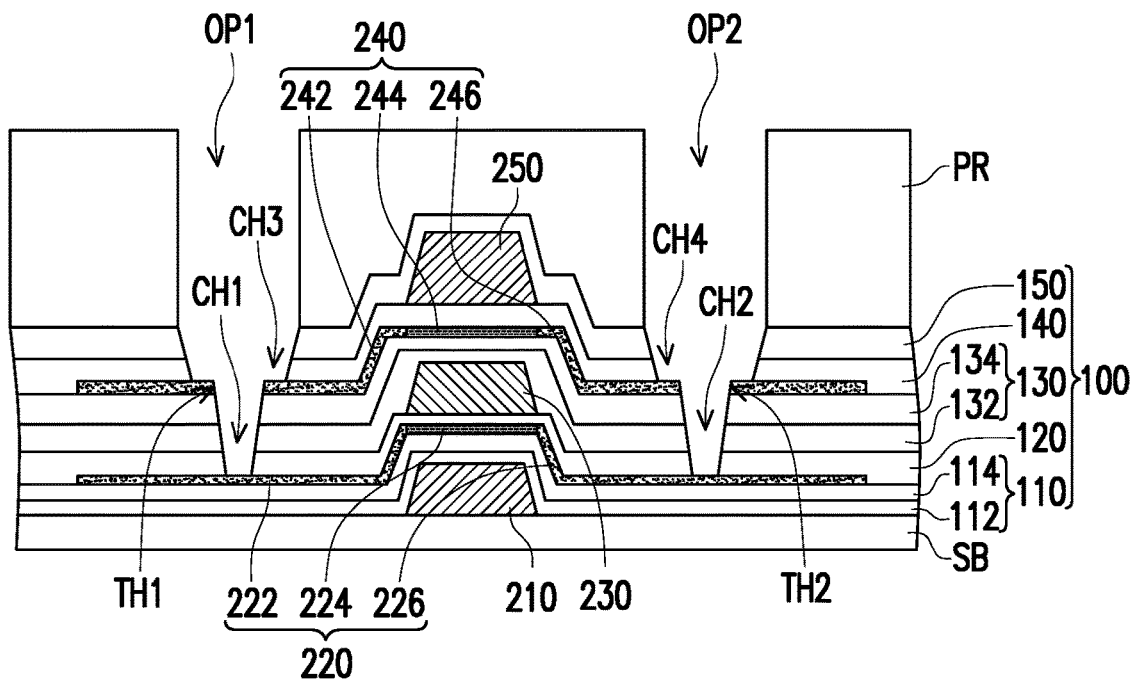

Please refer to FIG. 4D. Using the patterned photoresist layer PR as a mask, an etching process is executed on the protective layer 150, the fourth gate dielectric layer 140, the third gate dielectric layer 130, and the second gate dielectric layer 120. The first contact hole CH1, the second contact hole CH2, the third contact hole CH3, and the fourth contact hole CH4 may be formed together during the same etching process. In this embodiment, since the width of the first opening OP1 and the width of the second opening OP2 are respectively greater than the width of the first through hole TH1 and the width of the second through hole TH2, the third contact hole CH3 and the fourth contact hole CH4 expose on a part of the upper surface of the second semiconductor layer 240. The second semiconductor layer 240 also serves as a mask of the etching process, so that the width of the first contact hole CH1 and the width of the second contact hole CH2 are respectively less than the width of the third contact hole CH3 and the width of the fourth contact hole CH4. The first semiconductor layer 220 is an etch stop layer of the etching process.

Figure 4E:
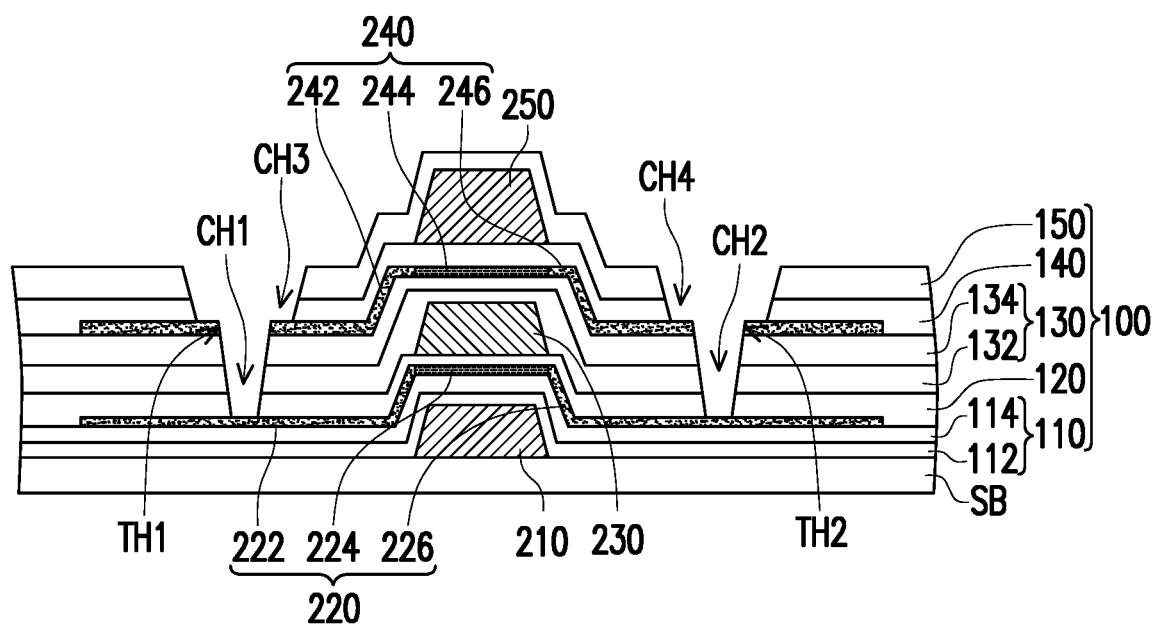

Please refer to FIG. 4E. The patterned photoresist layer PR is removed.

Finally, please return to FIG. 3B. The source 262 and the drain 264 are formed on the protective layer 150, and the source 262 and the drain 264 are filled into the first contact hole CH1, the second contact hole CH2, the third contact hole CH3, and the fourth contact hole CH4. So far, the semiconductor device 20 is roughly completed.

Figure 5A:
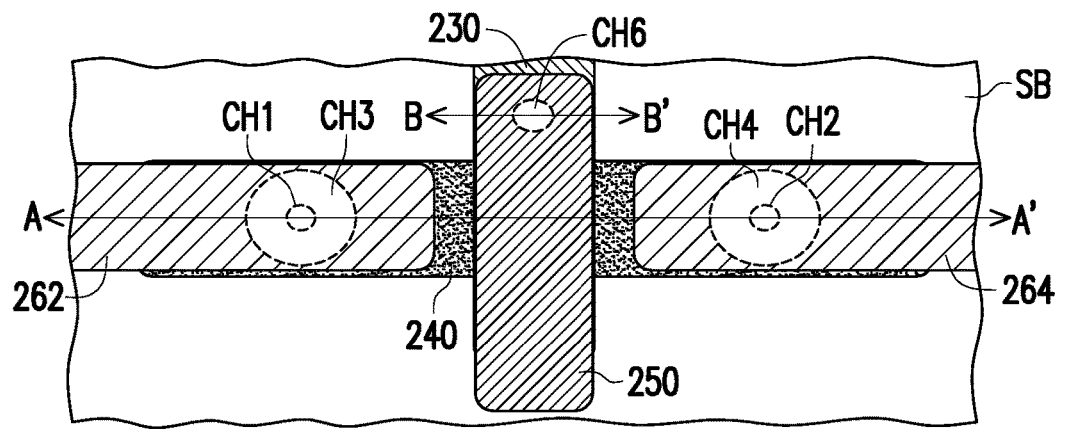
FIG. 5A is a schematic top view of a semiconductor device according to an embodiment of the disclosure.
Figure 5B:
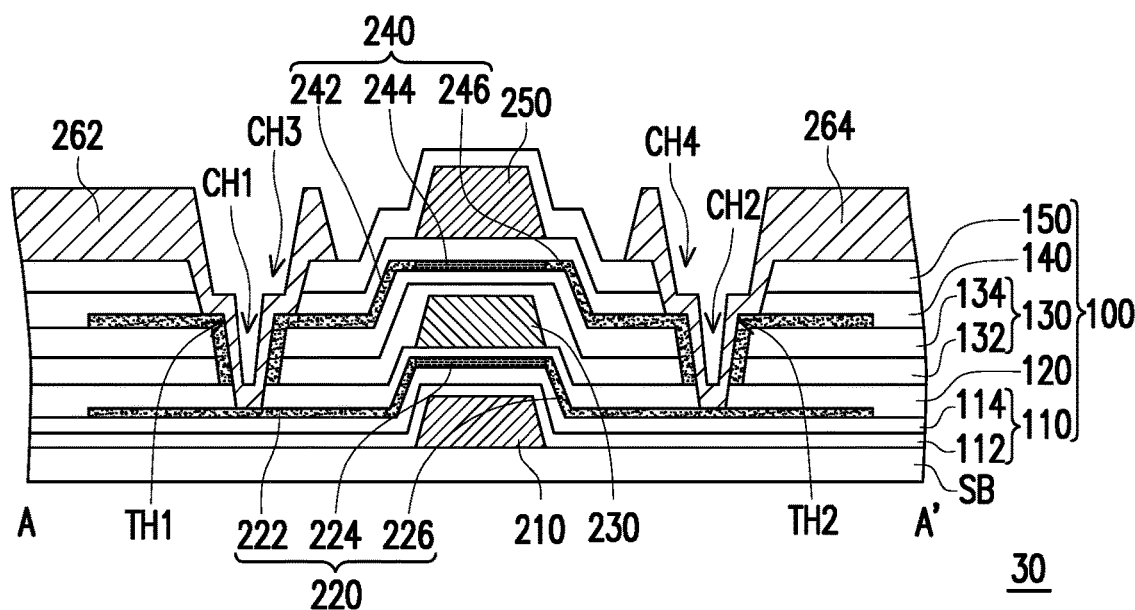
FIG. 5B is a schematic cross-sectional view taken along a line A-A' of FIG. 5A.
Figure 5C:
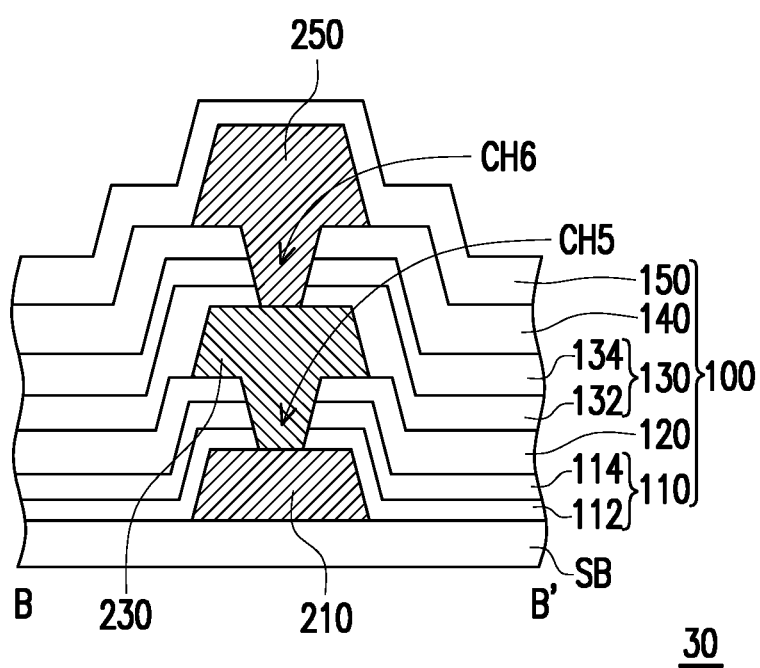
FIG. 5C is a schematic cross-sectional view taken along a line B-B' of FIG. 5A.

FIG. 5A is a schematic top view of a semiconductor device 30 according to an embodiment of the disclosure. FIG. 5B is a schematic cross-sectional view taken along a line A-A' of FIG. 5A. FIG. 5C is a schematic cross-sectional view taken along a line B-B' of FIG. 5A. It must be noted here that the embodiment of FIG. 5A to FIG. 5C continue to use the reference numerals and some content of the embodiment of FIG. 3A to FIG. 3C, the same or similar reference numerals are adopted to denote the same or similar elements, and the description of the same technical content is omitted. For the description of the omitted part, reference may be made to the foregoing embodiments, which will not be repeated here.

The main difference between the semiconductor device 30 of FIG. 5A to FIG. 5C and the semiconductor device 20 of FIG. 3A to FIG. 3C is that the second semiconductor layer 240 of the semiconductor device 30 covers a part of a sidewall of the first contact hole CH1 and a part of a sidewall of the second contact hole CH2.

Please refer to FIG. 5A to FIG. 5C. A part of the second semiconductor layer 240 extends toward the substrate SB along the sidewall of the first contact hole CH1 at the first contact hole CH1, and a part of the second semiconductor layer 240 extends toward the substrate SB along the sidewall of the second contact hole CH2 at the second contact hole CH2. The second semiconductor layer 240 is located between the source 262 and the third gate dielectric layer 130 and between the drain 264 and the third gate dielectric layer 130. In this embodiment, the second semiconductor layer 240 does not extend beyond a bottom surface of the third gate dielectric layer 130, but the disclosure is not limited thereto. In some embodiments, the second semiconductor layer 240 extends beyond the bottom surface of the third gate dielectric layer 130, but the second semiconductor layer 240 does not pass through the second gate dielectric layer 120.

In this embodiment, by adjusting the contact area between the source 262 and the first semiconductor layer 220, the contact area between the drain 264 and the first semiconductor layer 220, the contact area between the source 262 and the second semiconductor layer 240, and the contact area between the drain 264 and the second semiconductor layer 240, current may be more evenly distributed to the first semiconductor layer 220 and the second semiconductor layer 240.

In this embodiment, the first contact hole CH1 overlaps with the third contact hole CH3, so the distance between the source 262 and the first channel region 224 is approximately equal to the distance between the source 262 and the second channel region 244. Similarly, the second contact hole CH2 overlaps with the fourth contact hole CH4, so the distance between the drain 264 and the first channel region 224 is approximately equal to the distance between the drain 264 and the second channel region 244. As such, current may be more evenly distributed to the first semiconductor layer 220 and the second semiconductor layer 240.

Based on the above, the semiconductor device 30 includes the first semiconductor layer 220 and the second semiconductor layer 240, so as to disperse the current between the source 262 and the drain 264, and improve the negative influence caused by the current stress or the hot carrier effect. In addition, the driving voltage of the semiconductor device 30 may be less than the driving voltage of a dual-gate thin film transistor or a single-gate thin film transistor, so the semiconductor device 30 can obtain a preferred result in a PBTS test.

FIG. 6A to FIG. 6H are schematic cross-sectional views of a manufacturing method of the semiconductor device 30 of FIG. 5A to FIG. 5C.

Figure 6A:
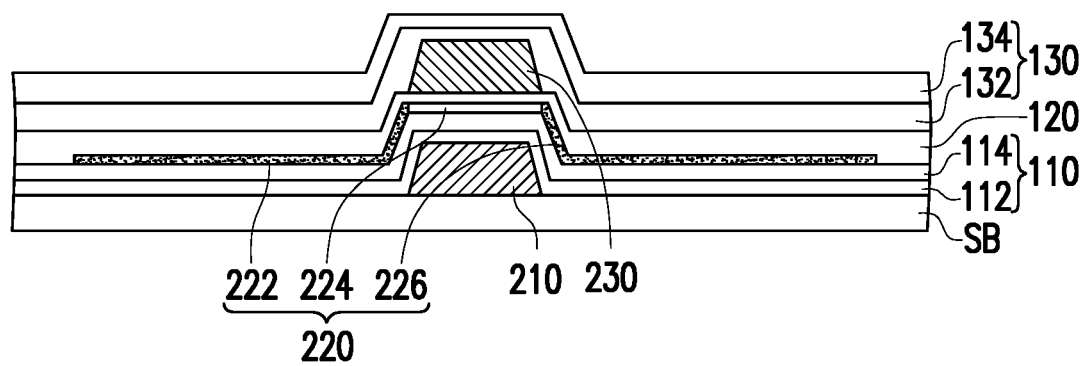
FIG. 6A to FIG. 6H are schematic cross-sectional views of a manufacturing method of the semiconductor device of FIG. 5A to FIG. 5C.

Please refer to FIG. 6A. Following the steps of FIG. 2C, the third gate dielectric layer 130 is formed on the second gate 230. The method of forming the third gate dielectric layer 130 includes forming the second nitride layer 132 on the second gate 230 and forming the second oxygen-containing dielectric layer 134 on the second nitride layer 132.

Figure 6B:
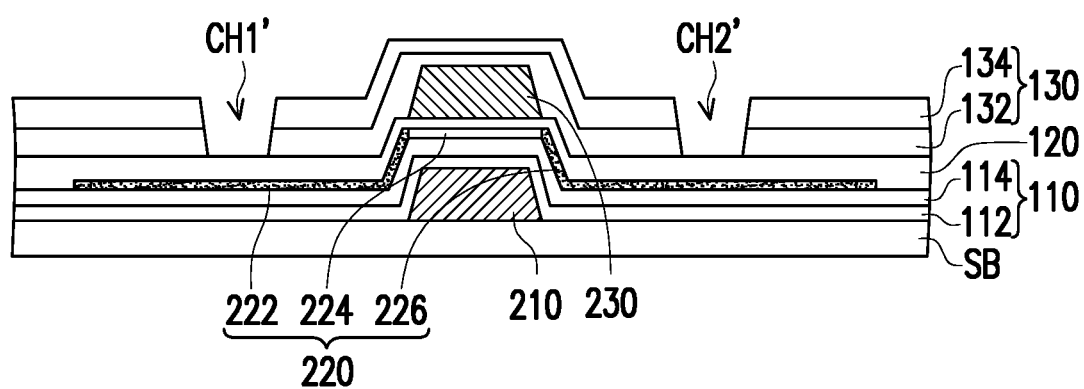

Please refer to FIG. 6B. An etching process is executed to form a first opening CH1' and a second opening CH2' penetrating the third gate dielectric layer 130. In this embodiment, the first opening CH1' and the second opening CH2' do not penetrate the second gate dielectric layer 120. In this embodiment, the etching process is stopped at the second gate dielectric layer 120.

Figure 6C:
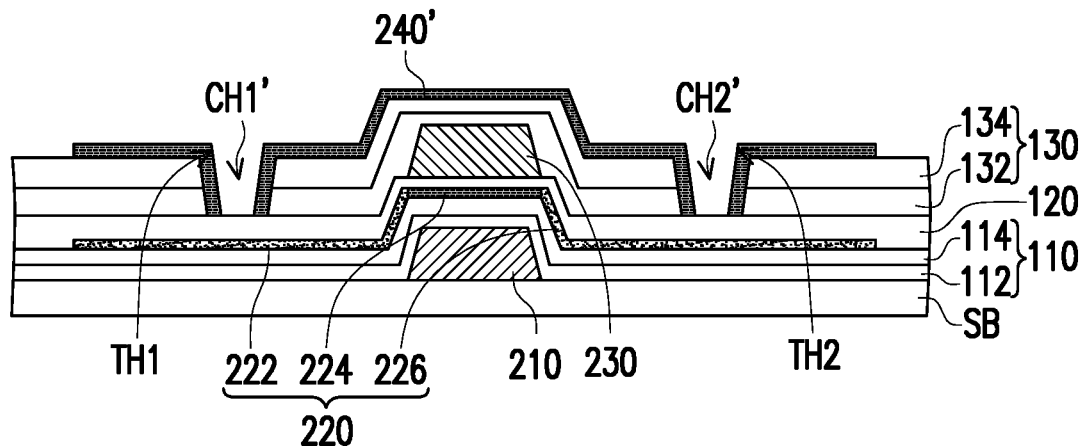

Please refer to FIG. 6C. The second semiconductor material layer 240' is formed on the third gate dielectric layer 130. The second semiconductor material layer 240' is filled into the first opening CHF and the second opening CH2', and contacts the second gate dielectric layer 120. The second semiconductor material layer 240' has the first through hole TH1 and the second through hole TH2. The first through hole TH1 exposes a part of the second gate dielectric layer 120 at the bottom of the first opening CH1'. The second through hole TH2 exposes a part of the second gate dielectric layer 120 at the bottom of the second opening CH2'.

Figure 6D:
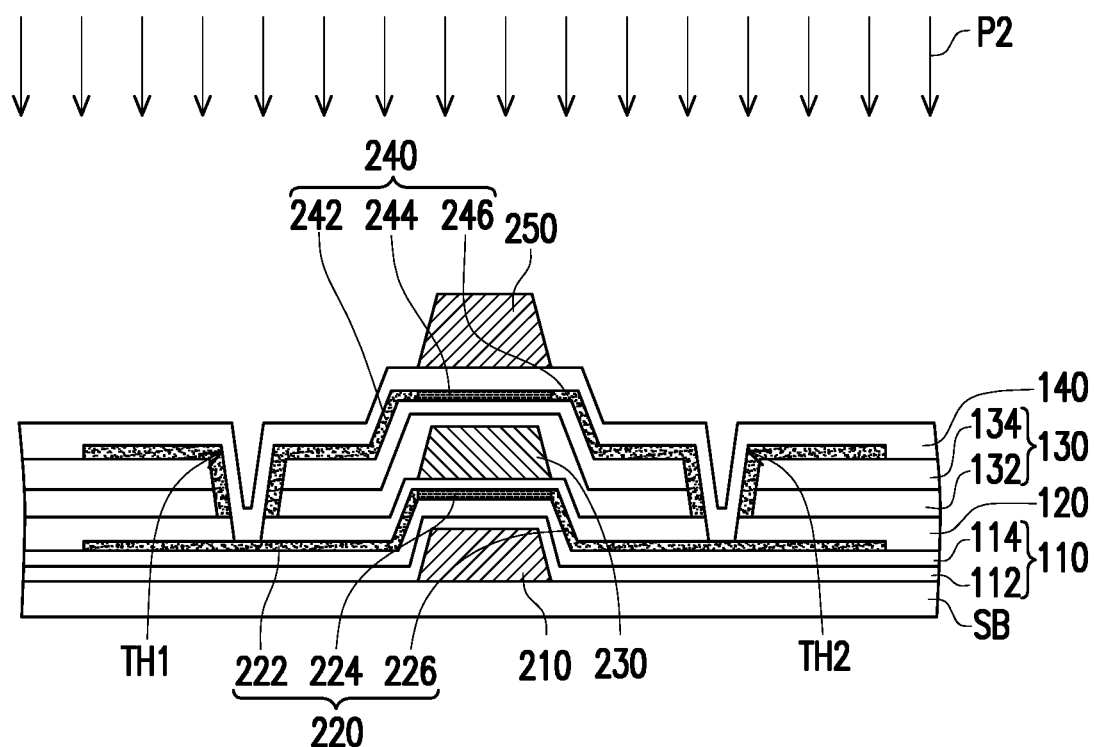

Please refer to FIG. 6D. The fourth gate dielectric layer 140 is formed on the second semiconductor material layer 240'. The fourth gate dielectric layer 140 is filled into the first opening CH1' and the second opening CH2', and contacts the second gate dielectric layer 120.

The third gate 250 is formed on the fourth gate dielectric layer 140. Using the third gate 250 as a mask, the doping process P2 is executed on the second semiconductor material layer 240' to form the second semiconductor layer 240 including the second source region 242, the second channel region 244, and the second drain region 246, wherein the second channel region 244 is aligned with the third gate 250. In some embodiments, the doping process P2 includes a hydrogen plasma process, an ion implantation process, or other suitable processes. In some embodiments, hydrogen elements in the formed gate dielectric layer and the subsequently formed gate dielectric layer and/or protective layer may diffuse into the second semiconductor layer 240 during the process, thereby changing the hydrogen content in the second semiconductor layer 240.

In some embodiments, before the third gate 250 is formed, an etching process is executed to form the sixth contact hole (please refer to FIG. 1C) penetrating the third gate dielectric layer 130 and the fourth gate dielectric layer 140, wherein the sixth contact hole exposes the second gate 230. Next, the third gate 250 is formed in the sixth contact hole to be electrically connected to the second gate 230.

Figure 6E:
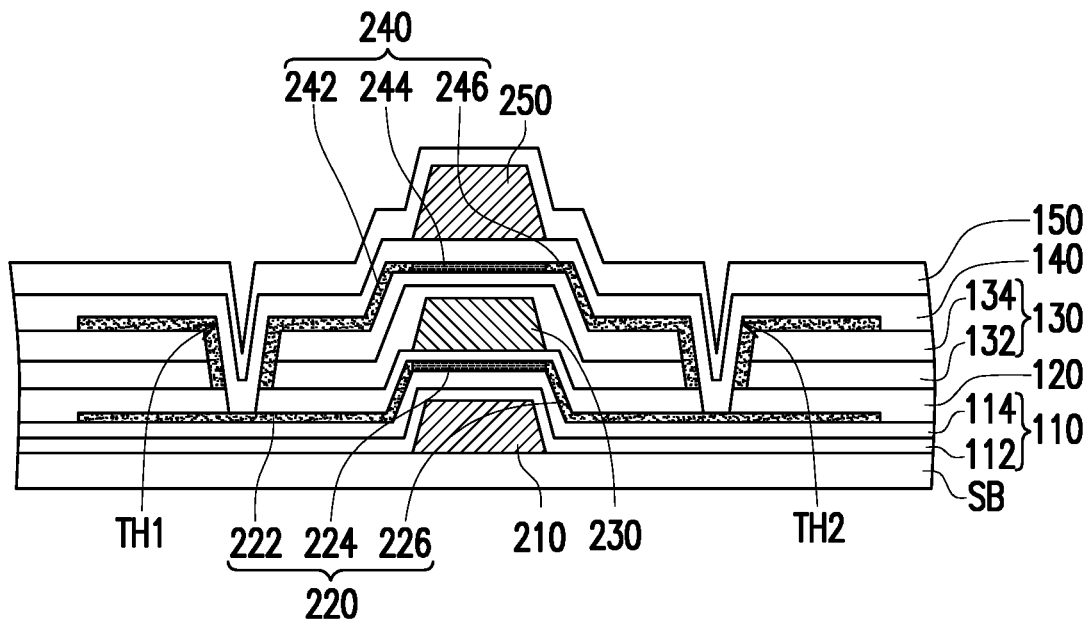

Please refer to FIG. 6E. The protective layer 150 is formed on the third gate 250.

Figure 6F:
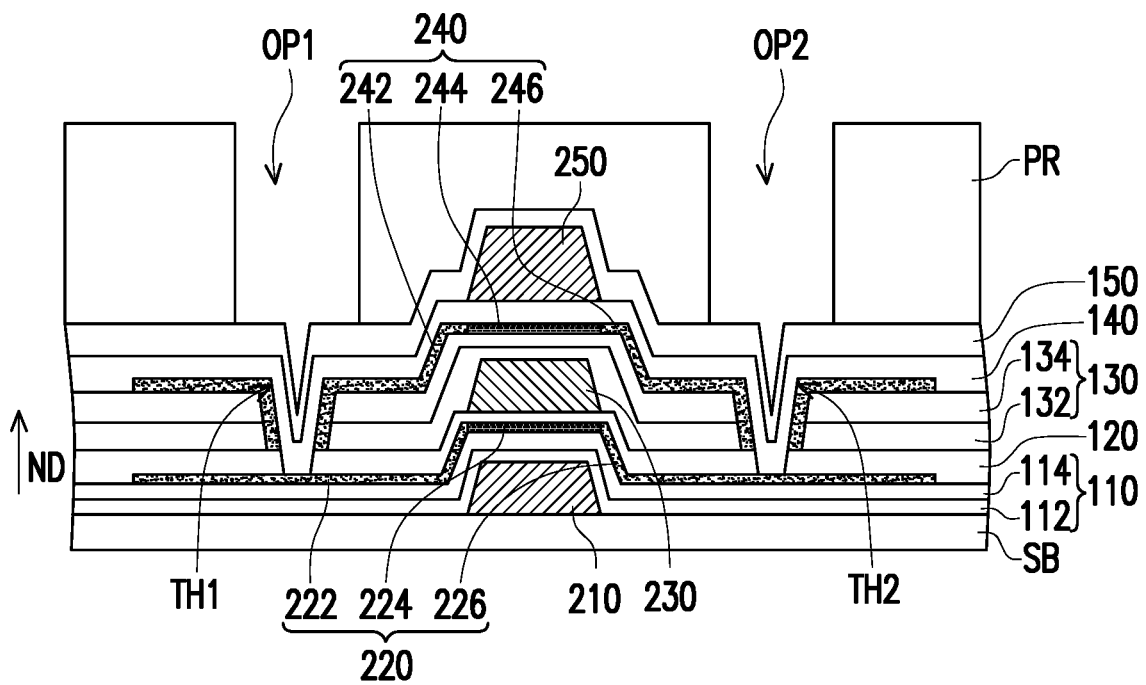

Please refer to FIG. 6F. The patterned photoresist layer PR is formed on the protective layer 150. The patterned photoresist layer PR includes the first opening OP1 and the second opening OP2, wherein the first opening OP1 and the second opening OP2 respectively overlap with the first through hole TH1 and the second through hole TH2 in the normal direction ND of the top surface of the substrate SB. The width of the first opening OP1 is greater than the width of the first through hole TH1, and the width of the second opening OP2 is greater than the width of the second through hole TH2.

Figure 6G:
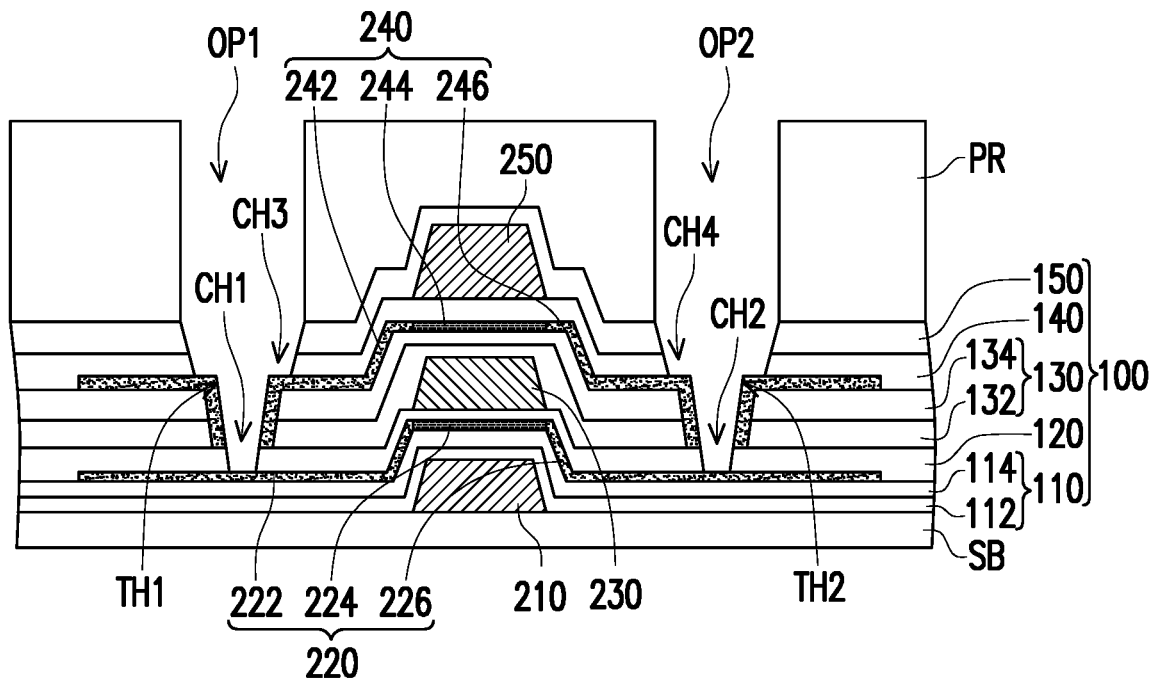

Please refer to FIG. 6G. Using the patterned photoresist layer PR as a mask, an etching process is executed on the protective layer 150, the fourth gate dielectric layer 140, the third gate dielectric layer 130, and the second gate dielectric layer 120. The first contact hole CH1, the second contact hole CH2, the third contact hole CH3, and the fourth contact hole CH4 may be formed together during the same etching process. In this embodiment, since the width of the first opening OP1 and the width of the second opening OP2 are respectively greater than the width of the first through hole TH1 and the width of the second through hole TH2, the third contact hole CH3 and the fourth contact hole CH4 expose a part of the upper surface of the second semiconductor layer 240. The second semiconductor layer 240 also serves as a mask of the etching process, so that the width of the first contact hole CH1 and the width of the second contact hole CH2 are respectively less than the width of the third contact hole CH3 and the width of the fourth contact hole CH4. The first semiconductor layer 220 is an etch stop layer of the etching process.

Figure 6H:
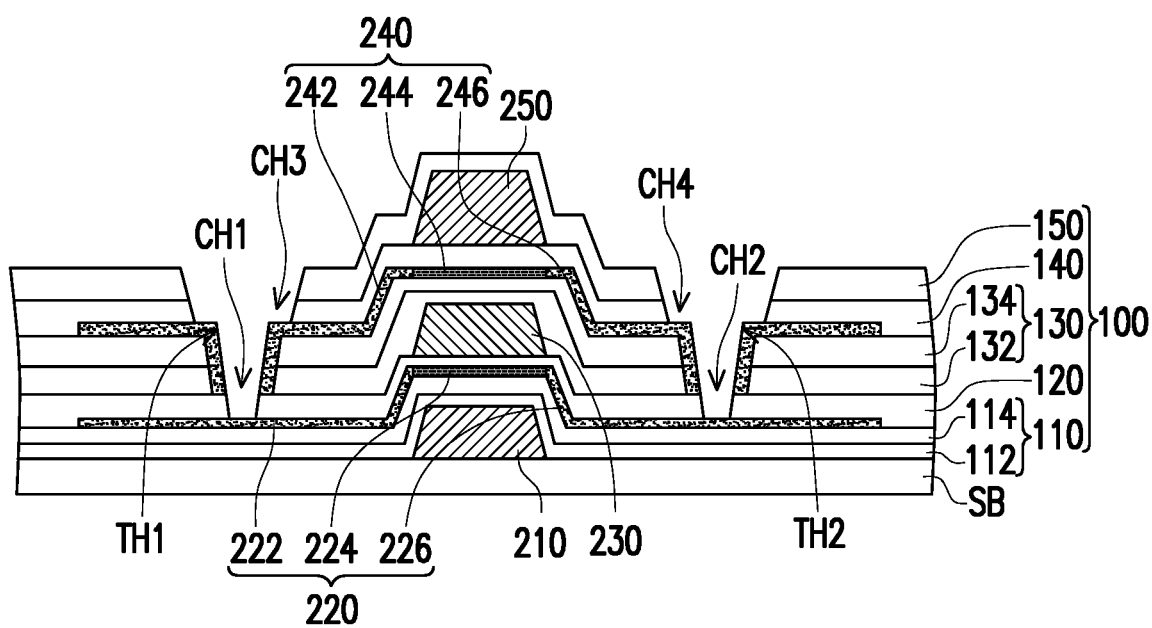

Please refer to FIG. 6H. The patterned photoresist layer PR is removed.

Finally, please return to FIG. 5B. The source 262 and the drain 264 are formed on the protective layer 150, and the source 262 and the drain 264 are filled into the first contact hole CH1, the second contact hole CH2, the third contact hole CH3, and the fourth contact hole CH4. So far, the semiconductor device 30 is roughly completed.

Figure 7A:
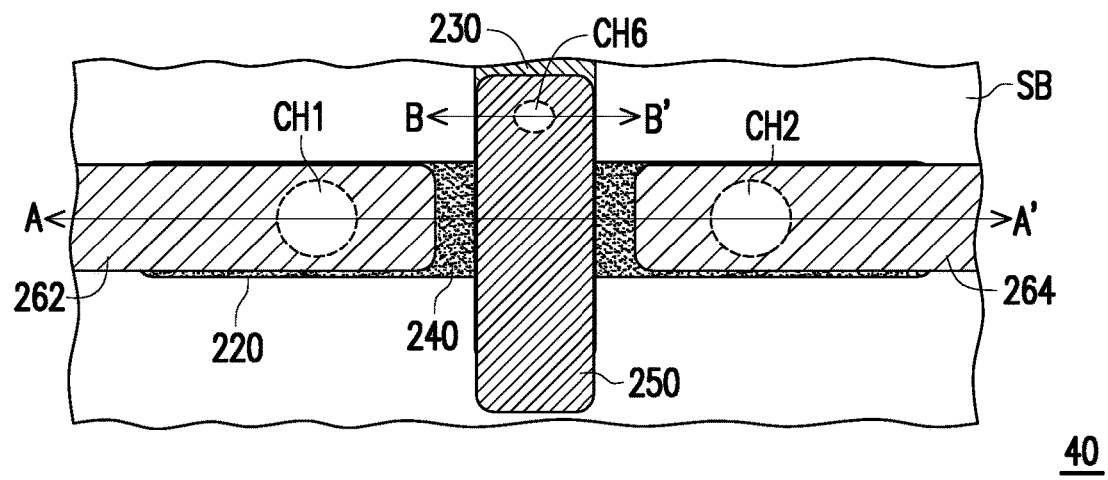
FIG. 7A is a schematic top view of a semiconductor device according to an embodiment of the disclosure.
Figure 7B:
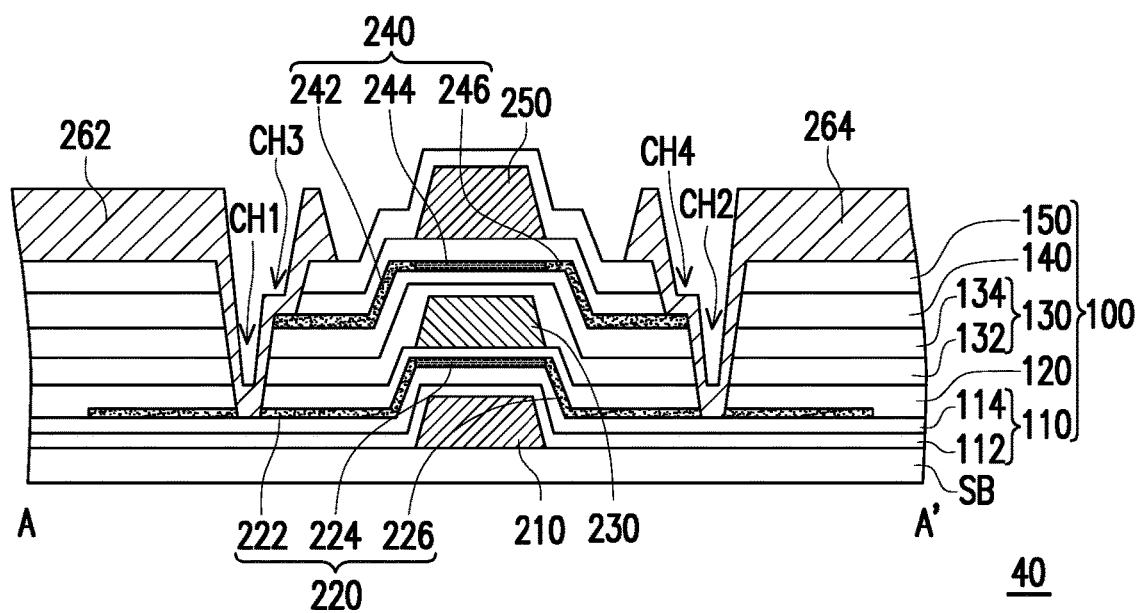
FIG. 7B is a schematic cross-sectional view taken along a line A-A' of FIG. 7A.
Figure 7C:
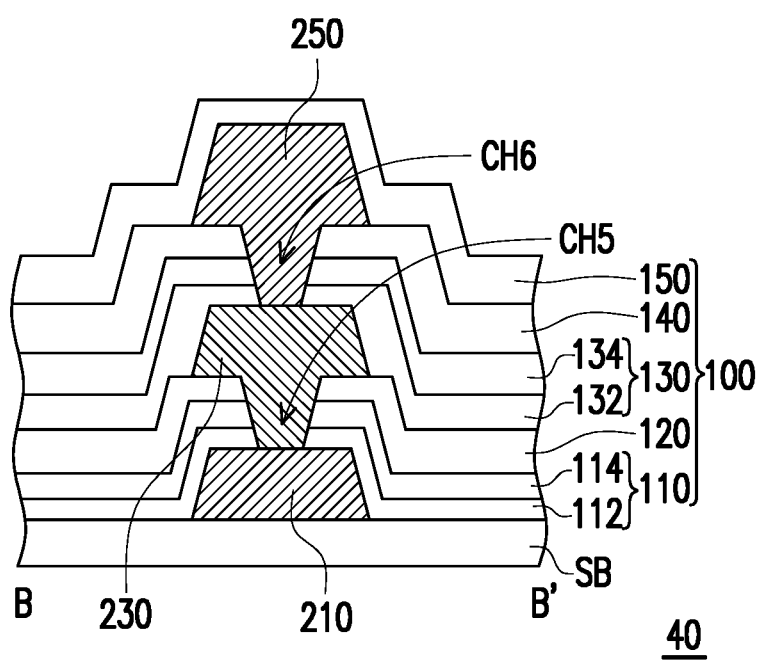
FIG. 7C is a schematic cross-sectional view taken along a line B-B' of FIG. 7A.

FIG. 7A is a schematic top view of a semiconductor device 40 according to an embodiment of the disclosure. FIG. 7B is a schematic cross-sectional view taken along a line A-A' of FIG. 7A. FIG. 7C is a schematic cross-sectional view taken along a line B-B' of FIG. 7A. It must be noted here that the embodiment of FIG. 7A to FIG. 7C continue to use the reference numerals and some content of the embodiment of FIG. 1A to FIG. 1C, wherein the same or similar reference numerals are adopted to denote the same or similar elements, and the description of the same technical content is omitted. For the description of the omitted part, reference may be made to the foregoing embodiments, which will not be repeated here.

The main difference between the semiconductor device 40 of FIG. 7A to FIG. 7C and the semiconductor device 10 of FIG. 1A to FIG. 1C is that the source 262 and the drain 264 of the semiconductor device 40 contact two opposite outer sidewalls of the second semiconductor layer 240.

Please refer to FIG. 7A to FIG. 7C. The first contact hole CH1 and the second contact hole CH2 penetrate the second gate dielectric layer 120 and the third gate dielectric layer 130. The first contact hole CH1 and the second contact hole CH2 are located under the two opposite outer sidewalls of the second semiconductor layer 240. The third contact hole CH3 and the fourth contact hole CH4 penetrate the fourth gate dielectric layer 140 and the protective layer 150. The third contact hole CH3 and the fourth contact hole CH4 respectively overlap with the first contact hole CH1 and the second contact hole CH2. The width of the third contact hole CH3 and the width of the fourth contact hole CH4 are respectively greater than the width of the first contact hole CH1 and the width of the second contact hole CH2.

The source 262 is filled into the first contact hole CH1 and the third contact hole CH3 to be electrically connected to the first source region 222 of the first semiconductor layer 220 and the second source region 242 of the second semiconductor layer 240. The drain 264 is filled into the second contact hole CH2 and the fourth contact hole CH4 to be electrically connected to the first drain region 226 of the first semiconductor layer 220 and the second drain region 246 of the second semiconductor layer 240. The source 262 and the drain 264 contact the two opposite outer sidewalls and the upper surface of the second semiconductor layer 240.

In this embodiment, the first contact hole CH1 overlaps with the third contact hole CH3, so the distance between the source 262 and the first channel region 224 is approximately equal to the distance between the source 262 and the second channel region 244. Similarly, the second contact hole CH2 overlaps with the fourth contact hole CH4, so the distance between the drain 264 and the first channel region 224 is approximately equal to the distance between the drain 264 and the second channel region 244. As such, current may be more evenly distributed to the first semiconductor layer 220 and the second semiconductor layer 240.

Based on the above, the semiconductor device 40 includes the first semiconductor layer 220 and the second semiconductor layer 240, so as to disperse the current between the source 262 and the drain 264, and improve the negative influence caused by the current stress or the hot carrier effect. In addition, the driving voltage of the semiconductor device 40 may be less than the driving voltage of a dual-gate thin film transistor or a single-gate thin film transistor, so the semiconductor device 40 can obtain a preferred result in a PBTS test.

Figure 8:
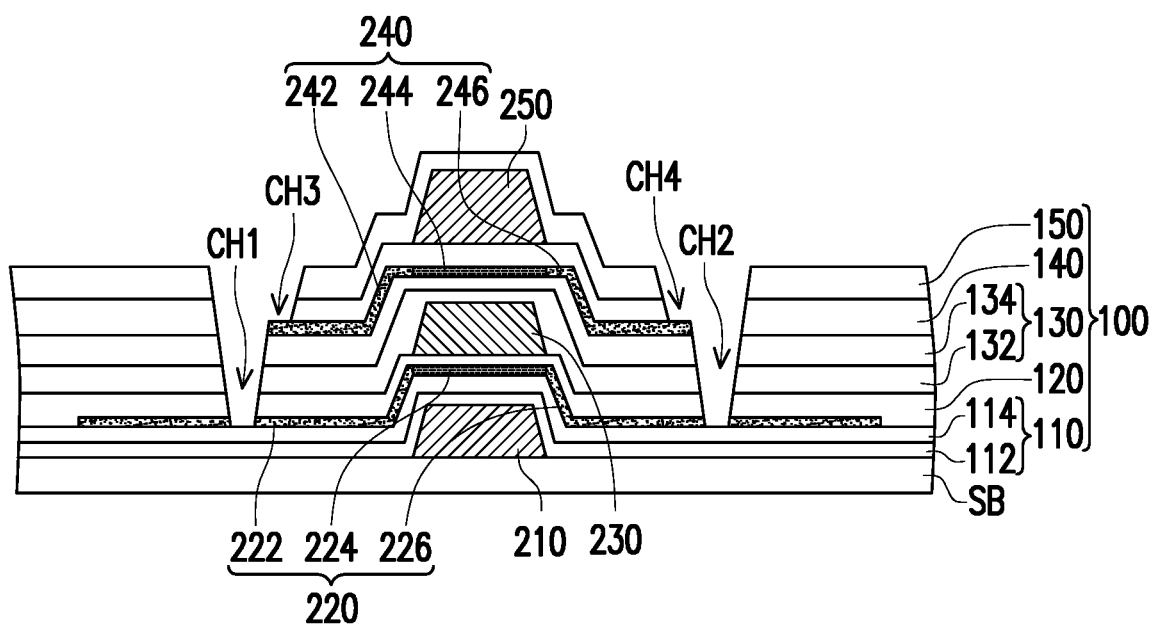
FIG. 8 is a schematic cross-sectional view of a manufacturing method of the semiconductor device of FIG. 7A to FIG. 7C.

FIG. 8 is a schematic cross-sectional view of a manufacturing method of the semiconductor device 40 of FIG. 7A to FIG. 7C.

Please refer to FIG. 8. Following the steps of FIG. 2F, a patterning process is executed to form the insulating structure 100 having the first contact hole CH1, the second contact hole CH2, the third contact hole CH3, and the fourth contact hole CH4. The first contact hole CH1 and the second contact hole CH2 respectively expose the first source region 222 and the first drain region 226 of the first semiconductor layer 220, and the third contact hole CH3 and the fourth contact hole CH4 respectively expose the second source region 242 and the second drain region 246 of the second semiconductor layer 240. In some embodiments, the patterning process includes the following steps. A patterned photoresist layer (not shown) is formed on the protective layer 150. Then, using the patterned photoresist layer as a mask, an etching process is executed on the protective layer 150, the fourth gate dielectric layer 140, the third gate dielectric layer 130, and the second gate dielectric layer 120. The second semiconductor layer 240 may serve as a mask of the etching process, and the first semiconductor layer 220 may serve as an etch stop layer of the etching process. In other words, the first contact hole CH1, the second contact hole CH2, the third contact hole CH3, and the fourth contact hole CH4 may be formed together during the same etching process.

Finally, please return to FIG. 7B. The source 262 and the drain 264 are formed on the protective layer 150, and the source 262 and the drain 264 are filled into the first contact hole CH1, the second contact hole CH2, the third contact hole CH3, and the fourth contact hole CH4. So far, the semiconductor device 40 is roughly completed.

Figure 9:
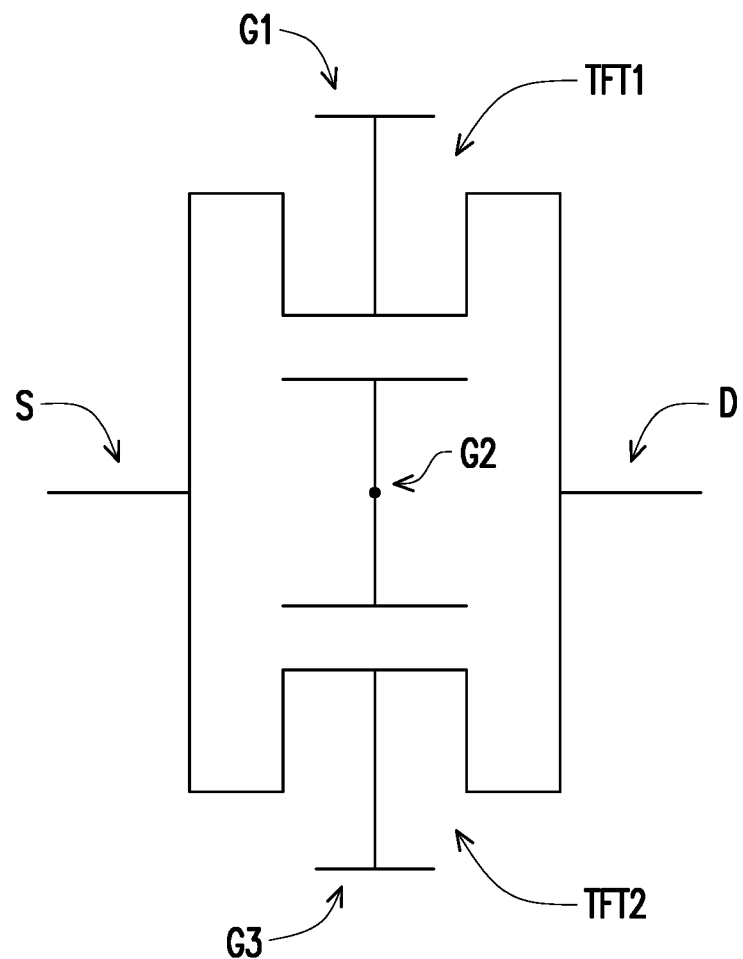
FIG. 9 is a schematic diagram of an equivalent circuit of a semiconductor device according to an embodiment of the disclosure.

FIG. 9 is a schematic diagram of an equivalent circuit of a semiconductor device according to an embodiment of the disclosure. For example, FIG. 9 is, for example, a schematic diagram of an equivalent circuit of the semiconductor device 10 of FIG. 1A to FIG. 1C, the semiconductor device 20 of FIG. 3A to FIG. 3C, the semiconductor device 30 of FIG. 5A to FIG. 5C, or the semiconductor device 40 of FIG. 7A to FIG. 7C.

Please refer to FIG. 9. The equivalent circuit of the semiconductor device is substantially equal to two switching elements TFT1 and TFT2 connected together. The switching element TFT1 includes a gate G1, the switching element TFT2 includes a gate G3, and the switching element TFT1 and the switching element TFT2 share a gate G2. The switching element TFT1 and the switching element TFT2 share a source S, and the switching element TFT1 and the switching element TFT2 share a drain D. Current is distributed to a channel (for example, the first semiconductor layer) of the switching element TFT1 and a channel (for example, the second semiconductor layer) of the switching element TFT2, so the negative influence caused by the current stress or the hot carrier effect can be improved.

What is claimed is:

1. A semiconductor device, comprising:
    a first gate, a second gate, and a third gate;
    a first semiconductor layer and a second semiconductor layer, wherein the first semiconductor layer is located between the first gate and the second gate, the second gate is located between the first semiconductor layer and the second semiconductor layer, the second semiconductor layer is located between the second gate and the third gate, and the second semiconductor layer has a first through hole and a second through hole;
    a source, electrically connected to the first semiconductor layer and the second semiconductor layer, wherein the source passes through the first through hole to be electrically connected to the first semiconductor layer; and
    a drain, electrically connected to the first semiconductor layer and the second semiconductor layer, wherein the drain passes through the second through hole to be electrically connected to the first semiconductor layer.

2. The semiconductor device according to claim 1, further comprising:
    an insulating structure, covering the first gate, the second gate, the third gate, the first semiconductor layer, and the second semiconductor layer, wherein the insulating structure has a first contact hole, a second contact hole, a third contact hole, and a fourth contact hole, wherein the source and the drain are respectively filled into the first contact hole and the second contact hole to be electrically connected to the first semiconductor layer, and the source and the drain are respectively filled into the third contact hole and the fourth contact hole to be electrically connected to the second semiconductor layer.

3. The semiconductor device according to claim 1, further comprising:
    a first gate dielectric layer, located between the first gate and the first semiconductor layer;
    a second gate dielectric layer, located between the first semiconductor layer and the second gate;
    a third gate dielectric layer, located between the second gate and the second semiconductor layer, wherein a first contact hole and a second contact hole penetrate the second gate dielectric layer and the third gate dielectric layer, the first contact hole and the second contact hole respectively overlap with the first through hole and the second through hole, and the source and the drain are respectively filled into the first contact hole and the second contact hole; and a fourth gate dielectric layer, located between the second semiconductor layer and the third gate, wherein a third contact hole and a fourth contact hole penetrate the fourth gate dielectric layer, the third contact hole and the fourth contact hole respectively overlap with the first through hole and the second through hole, and the source and the drain are respectively filled into the third contact hole and the fourth contact hole.

4. The semiconductor device according to claim 3, wherein a width of the third contact hole and a width of the fourth contact hole are respectively greater than a width of the first through hole and a width of the second through hole.

5. The semiconductor device according to claim 3, wherein the second semiconductor layer covers a part of a sidewall of the first contact hole and a part of a sidewall of the second contact hole.

6. The semiconductor device according to claim 5, wherein the second semiconductor layer is located between the source and the third gate dielectric layer and between the drain and the third gate dielectric layer.

7. The semiconductor device according to claim 1, wherein the first gate, the second gate, and the third gate are electrically connected to each other.

8. The semiconductor device according to claim 1, wherein a length of the second semiconductor layer is less than a length of the first semiconductor layer.

9. The semiconductor device according to claim 1, wherein the first semiconductor layer and the second semiconductor layer comprise a same material.

10. The semiconductor device according to claim 1, wherein the first semiconductor layer and the second semiconductor layer comprise a same thickness.

11. The semiconductor device according to claim 1, further comprising:
   a first gate dielectric layer, located between the first gate and the first semiconductor layer, wherein the first gate dielectric layer comprises a first nitride layer and a first oxygen-containing dielectric layer, wherein the first nitride layer contacts the first gate and the first oxygen-containing dielectric layer contacts the first semiconductor layer;
   a second gate dielectric layer, located between the first semiconductor layer and the second gate;
   a third gate dielectric layer, located between the second gate and the second semiconductor layer, wherein the third gate dielectric layer comprises a second nitride layer and a second oxygen-containing dielectric layer, wherein the second nitride layer contacts the second gate and the second oxygen-containing dielectric layer contacts the second semiconductor layer; and
   a fourth gate dielectric layer, located between the second semiconductor layer and the third gate.

12. A semiconductor device, comprising:
   a first gate, a second gate, and a third gate;
   a first semiconductor layer and a second semiconductor layer, wherein the first semiconductor layer is located between the first gate and the second gate, the second gate is located between the first semiconductor layer and the second semiconductor layer, and the second semiconductor layer is located between the second gate and the third gate;
   a source, electrically connected to the first semiconductor layer and the second semiconductor layer;
   a drain, electrically connected to the first semiconductor layer and the second semiconductor layer, wherein the source and the drain contact two opposite outer sidewalls of the second semiconductor layer; and
   an insulating structure, comprising:
      a first gate dielectric layer, located between the first gate and the first semiconductor layer;
      a second gate dielectric layer, located between the first semiconductor layer and the second gate;
      a third gate dielectric layer, located between the second gate and the second semiconductor layer, wherein a first contact hole and a second contact hole penetrate the second gate dielectric layer and the third gate dielectric layer, and the first contact hole and the second contact hole are located under the two opposite outer sidewalls of the second semiconductor layer; and
      a fourth gate dielectric layer, located between the second semiconductor layer and the third gate, wherein a third contact hole and a fourth contact hole penetrate the fourth gate dielectric layer, the third contact hole and the fourth contact hole respectively overlap with the first contact hole and the second contact hole, the source is filled into the first contact hole and the third contact hole to be electrically connected to the first semiconductor layer and the second semiconductor layer, the drain is filled into the second contact hole and the fourth contact hole to be electrically connected to the first semiconductor layer and the second semiconductor layer, and a width of the third contact hole and a width of the fourth contact hole are respectively greater than a width of the first contact hole and a width of the second contact hole.

13. The semiconductor device according to claim 12, wherein the source and the drain contact the two opposite outer sidewalls and an upper surface of the second semiconductor layer.

* * * * *